(12) United States Patent
Fukushima et al.

(10) Patent No.: US 7,425,475 B2
(45) Date of Patent: Sep. 16, 2008

(54) METHOD FOR FABRICATING SEMICONDUCTOR DEVICE AND SEMICONDUCTOR DEVICE

(75) Inventors: Yasumori Fukushima, Nara (JP); Masao Moriguchi, Nara (JP); Yutaka Takafuji, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 381 days.

(21) Appl. No.: 11/199,166

(22) Filed: Aug. 9, 2005

(65) Prior Publication Data

US 2006/0043485 A1 Mar. 2, 2006

(30) Foreign Application Priority Data

Aug. 26, 2004 (JP) .............................. 2004-246579

(51) Int. Cl.
*H01L 21/00* (2006.01)
(52) U.S. Cl. .................. 438/151; 438/225; 438/297
(58) Field of Classification Search ................ 438/151, 438/225, 297, 407, 458, 459, 528
See application file for complete search history.

(56) References Cited

U.S. PATENT DOCUMENTS

| | | | |
|---|---|---|---|
| 6,503,778 B1 * | 1/2003 | Yamauchi et al. | 438/107 |
| 7,183,179 B2 * | 2/2007 | Droes et al. | 438/473 |
| 2004/0061176 A1 | 4/2004 | Takafuji et al. | |
| 2005/0087739 A1 * | 4/2005 | Ogawa et al. | 257/59 |

FOREIGN PATENT DOCUMENTS

| | | |
|---|---|---|
| JP | 4-3457 A | 1/1992 |
| JP | 7-169961 A | 7/1995 |
| JP | 7-201773 A | 8/1995 |
| JP | 11-297972 | 10/1999 |
| JP | 2001-28354 A | 1/2001 |
| JP | 2003-7816 A | 1/2003 |
| JP | 2003-142667 A | 5/2003 |
| JP | 2004-165600 A | 6/2004 |

OTHER PUBLICATIONS

Bruel et al., *Smart-Cut: A New Silicon On Insulator Material Technology Based on Hydrogen Implantation and Wafer Bonding*, Jpn. J. Appl. Phys., vol. 36, part 1., No. 3B, Mar. 1997, pp. 1636-1641.
Japanese Notice of Rejection mailed Jan. 22, 2008 in JP application 2004-246579.

* cited by examiner

*Primary Examiner*—Tuan H Nguyen
(74) *Attorney, Agent, or Firm*—Nixon & Vanderhye, P.C.

(57) ABSTRACT

A method for fabricating a semiconductor device according to the present invention is a method for fabricating a semiconductor device including a substrate layer including a plurality of first regions each having an active region and a plurality of second regions each being provided between adjacent ones of the first region. The fabrication method includes an isolation insulation film formation step of forming an isolation insulation film in each of the second regions so that a surface of the isolation insulation film becomes at the same height as that of a surface of a gate oxide film covering the active region, a peeling layer formation step of forming a peeling layer by ion-implanting hydrogen into the substrate layer after the isolation insulation film formation step, and a separation step of separating part of the substrate layer along the peeling layer.

32 Claims, 17 Drawing Sheets

METHOD FOR FABRICATING SEMICONDUCTOR DEVICE AND SEMICONDUCTOR DEVICE

CROSS-REFERENCE TO RELATED APPLICATIONS

The disclosure of Japanese Patent Application No. 2004-246579 filed on Aug. 26, 2004 including specification, drawings and claims are incorporated herein by reference in its entirety.

BACKGROUND OF THE INVENTION

The present invention relates to a method for fabricating semiconductor device and a semiconductor device.

Conventionally, a SOI (silicon on insulator) substrate that is a silicon substrate in which a monocrystal silicon layer is formed on a surface of an insulation layer has been known. By forming a device such as a transistor on a SOI substrate, parasitic capacitance can be reduced and insulation resistance can be increased. That is, high-integration and high-performance for a device can be achieved. The insulation layer is formed of, for example, a silicon oxide ($SiO_2$) film.

To increase an operation speed of a device and further reduce parasitic capacitance of the device, the SOI substrate is preferably formed so that a monocrystal silicon layer has a small thickness. Then, conventionally, a method in which a silicon substrate is bonded to some other substrate such as a glass substrate and then part of the silicon substrate is removed by separation, thereby forming a SOI substrate, has been known (see, for example, Michel Bruel, "Smart-Cut: A New Silicon On Insulator Material Technology Based on Hydrogen Implantation and Wafer Bonding", Jpn. J. Appl. Phys., Vol. 36 (1997), pp. 1636-1641).

Hereinafter, a method for forming a SOI substrate by bonding will be described with reference to FIG. 31. Among various techniques for reducing the thickness of a SOI layer, such as chemical polishing and a technique using porous silicon, a method using hydrogen implantation will be herein described. First, as shown in FIG. 28, a surface of a silicon substrate 101 serving as a first substrate is treated by oxidation, thereby forming a silicon oxide ($SiO_2$) layer 102 serving as an insulation layer. Next, as shown in FIG. 29, ions of hydrogen, i.e., a peeling material are implanted into the silicon substrate 101 through the silicon oxide ($SiO_2$) layer 102. Thus, a hydrogen-implanted layer 104 serving as a peeling layer is formed in part of the silicon substrate 101 located at a predetermined depth. Subsequently, RCA cleaning or like substrate surface cleaning is performed, and then, as shown in FIG. 30, a second substrate such as a glass substrate 103 is bonded to a surface of the silicon oxide layer 102. Thereafter, heat treatment is performed, so that a micro-clack is formed in part of the silicon substrate 101 located at the depth where hydrogen ions have been implanted. Thus, as shown in FIG. 31, part of the silicon substrate 101 is separated along the hydrogen-implanted layer 104. In this manner, the thickness of the silicon substrate 101 is reduced, thereby obtaining a silicon layer 101. After separation, the thickness of the silicon layer 101 is reduced to a desired thickness using polishing, etching or other various techniques as necessary. Also, using heat treatment or the like, crystal defects generated by hydrogen implantation is repaired and a silicon surface is smoothed.

In the above-described manner, the $SiO_2$ layer (insulation layer) 102 is formed on the surface of the glass substrate (second substrate) 103 and the SOI substrate in which the silicon layer 101 is formed on the surface of the $SiO_2$ layer 102 so as to have a small thickness is formed.

Moreover, in general, it has been known that when a plurality of devices are formed on a substrate, in order to provide insulation adjacent ones of the plurality of devices from one another for isolation, for example, using a LOCOS (local oxidation of silicon) technique, a selective oxidation film (which will be herein referred to as a "LOCOS oxide film") is formed. A general LOCOS oxide film is formed in the following manner. First, a silicon nitride film is formed over an oxide film formed on a surface of a silicon substrate and patterned. Then, oxidation is performed to the silicon substrate, so that an oxide film is selectively formed on a surface of part of the silicon substrate which is not covered by the silicon nitride film. Thus, a LOCOS oxide film is obtained. When forming a LOCOS oxide film, in the silicon substrate, silicon with a thickness corresponding to about 45% of the thickness of the LOCOS oxide film is consumed. As a result, a surface of the LOCOS oxide film becomes higher than a surface of part of the silicon substrate which is not oxidized by about half of the thickness of the LOCOS oxide film, so that level differences are generated.

The above-described structure including the LOCOS oxide film (which will be herein referred to as a "LOCOS isolation structure") is formed on the silicon substrate 101, as shown in FIG. 32. A plurality of isolation regions and active regions are provided on a surface of the silicon substrate 101. In each of the isolation regions, a LOCOS oxide film 112 is formed and each of the active regions is located between adjacent ones of the isolation regions. In each of the active regions, for example, a gate electrode 111 of a MOS transistor is provided. On the other hand, a gate interconnect layer 113 is provided on the LOCOS oxide film 112 in each of the isolation regions. Furthermore, an insulation film 114 is formed over the gate electrode 111 and the gate interconnect layer 113 to flatten a surface of the entire substrate.

BRIEF SUMMARY

The present inventors found that by forming a hydrogen-implanted layer in a semiconductor substrate including a semiconductor device portion such as a MOS transistor to separate part of the silicon substrate, the semiconductor device portion can be formed on another substrate so as to have a small thickness. Therefore, with use of a transparent substrate as a substrate to which the semiconductor device portion is formed, a semiconductor device of which the semiconductor device portion has a reduced thickness can be applied to a liquid crystal display device.

However, when the LOCOS oxide film is formed using the above-described general technique, as shown in FIG. 33, isolation regions and active regions are formed in different levels, thus resulting in poor controllability over ion implantation into the silicon substrate. That is, if it is intended to uniformly form a hydrogen-implanted layer at the same depth in the silicon substrate 101, in the isolation regions of which surfaces are at a higher level, hydrogen ions have to be implanted in deeper part of the substrate. Thus, ion implantation energy has to be increased accordingly. As a result, controllability over an ion implantation depth becomes difficult and thus controllability over the thickness of the silicon layer becomes poor. This results in poor controllability over electric characteristics of the semiconductor device.

Specifically, with such level differences, the hydrogen-implanted layer 115 is not reliably formed in the silicon substrate 101. As a result, it becomes very difficult to fabricate a semiconductor device including a silicon layer having an even thickness throughout a layer surface. Note that if there are level differences, the same problem arises not only in the case where the LOCOS oxide film is formed but also in other cases.

Moreover, as has been described, since the isolation regions and the active regions are formed at different levels, in order to flatten the surface of the insulation film 114 formed over the isolation regions and the active regions, part of the insulation film 114 located in the active regions has to have an increased thickness. Accordingly, a polishing amount in CMP (chemical mechanical polishing) for flattening the insulation film 114 is increased and also variation in the thickness of the insulation film 114 tends to be increased after flattening the surface of the insulation film 114.

In view of the above-described points, the present invention has been devised and it is therefore an object of the present invention to allow reliable formation of a peeling layer in a substrate layer and control over ion implantation of a peeling material in a simple manner.

To achieve the above-described object, a peeling layer is formed in a substrate layer so that surfaces of isolation regions or a surface of a LOCOS oxide film are located at the same height as that of a surface of a film covering active region of part of the substrate layer located in each first region.

Specifically, a method for fabricating a semiconductor device is directed to a method for fabricating a semiconductor device which includes a substrate layer including a plurality of first regions each having an active region and a plurality of second regions each being provided between adjacent ones of the first regions. The method includes: an isolation insulation film formation step of forming an isolation insulation film in each of the second regions so that a surface of the isolation insulation film becomes at the same height as that of a surface of a film covering the active region; a peeling layer formation step of forming a peeling layer by ion-implanting a peeling material into the substrate layer after the isolation insulation film formation step; and a separation step of separating part of the substrate layer along the peeling layer.

Moreover, another method for semiconductor device is directed to a method for fabricating a semiconductor device which includes a substrate layer including a plurality of first regions each having an active region and a plurality of second regions each being provided between adjacent ones of the first regions. The method includes: a recess formation step of forming a recess beforehand in a surface of part of the substrate layer located in each of the second regions; a LOCOS oxide film formation step of forming a LOCOS oxide film in the recess by a LOCOS technique so that a surface of the LOCOS oxide film becomes at the same height as that of a surface of the film covering the active region; a peeling layer formation step of forming a peeling layer by ion-implanting a peeling material into the substrate layer after the LOCOS oxide film formation step; and a separation step of separating part of the substrate layer along the peeling layer.

Moreover, another method for fabricating a semiconductor device is directed to a method for fabricating a semiconductor device which includes a substrate layer including a plurality of first regions each having an active region and a plurality of second regions each being provided between adjacent ones of the first regions. The method includes: a LOCOS oxide film formation step of forming a LOCOS oxide film in each of the second regions by a LOCOS technique; a flattening step of flattening a surface of the LOCOS oxide film in each of the second regions so that the surface of the LOCOS oxide film becomes at the same height as that of a surface of a film covering the active region; a peeling layer formation step of forming a peeling layer by ion-implanting a peeling material into the substrate layer after the flattening step; and a separation step of separating part of the substrate layer along the peeling layer.

Moreover, another method for fabricating a semiconductor device is directed to a method for fabricating a semiconductor device which includes a substrate layer including a plurality of first regions each having an active region and a plurality of second regions each being provided between adjacent ones of the first regions. The method includes: a recess formation step of forming a recess beforehand in a surface of part of the substrate layer located in each of the second regions; a flattening step of filling an isolation insulation film in the recess and then flattening the isolation insulation film so that a surface of a film covering the active region becomes at the same height as that of a surface of part of a surface of the isolation insulation film located in each of the second regions; a peeling layer formation step of forming a peeling layer by ion-implanting a peeling material into the substrate layer after the flattening film formation step; and a separation step of separating part of the substrate layer along the peeling layer.

A method for fabricating a semiconductor device according to an example mode may further include: a flattening film formation step of forming a flattening film so that the flattening film covers part of the substrate layer located in each of the first regions and the isolation insulation film; and a bonding step for bonding a substrate to the flattening film, and the bonding step may be performed before the separation step.

A method for fabricating a semiconductor device according to an example mode may further include: a flattening film formation step of forming a flattening film so that the flattening film covers part of the substrate layer located in each of the first regions and the LOCOS oxide film; and a bonding step of bonding a substrate to the flattening film, and the bonding step is performed before the separation step.

It is preferable that the substrate is a glass substrate.

The substrate layer may be a silicon layer.

It is preferable that the peeling material is hydrogen.

A MOS transistor may be formed in each of the first regions.

It is preferable that the film covering the active region is a gate oxide film and the method further includes the step of forming a gate electrode of the MOS transistor on a surface of the gate oxide film.

A MOS transistor may be formed in each of the first regions, the film covering the active region may be a gate oxide film, and the method further may further include the steps of: forming a gate electrode of the MOS transistor on a surface of the gate oxide film; and forming a gate interconnect layer in the isolation insulation film so that the gate interconnect layer is connected to the gate electrode of the MOS transistor.

A MOS transistor may be formed in each of the first regions, the film covering the active region may be a gate oxide film, and the method may further include the steps of: forming a gate electrode of the MOS transistor on a surface of the gate oxide film; and forming a gate interconnect layer in the LOCOS oxide film so that the gate interconnect layer is connected to the gate electrode of the MOS transistor.

It is preferable that a MOS transistor is formed in each of the first regions, the method further includes a conduction section formation step of forming a conduction section so that the conduction section is connected to a source or drain region of the MOS transistor, and the conduction section formation step is performed before the bonding step.

A MOS transistor may be formed in each of the first regions, the method may further include a conduction section formation step of forming a conduction section so that the conduction section is connected to a source or drain region of the MOS transistor, and the conduction section formation step may be performed after the bonding step.

An example semiconductor device includes a substrate layer including a plurality of first regions each having an active region and a plurality of second regions each being provided between adjacent ones of the first regions. In the semiconductor device, an isolation insulation film is formed in each of the second regions, the isolation insulation film is formed so that a surface of the isolation insulation film becomes at the same height as that of a surface of a film stacked over the active region, and part of the substrate layer is separated along a peeling layer formed by ion-implanting a peeling material, thereby removing the part of the substrate layer with the peeling layer.

Moreover, another semiconductor device includes a substrate layer including a plurality of first regions each having an active region and a plurality of second regions each being provided between adjacent ones of the first regions. In the semiconductor device, a recess is formed in a surface of part of the substrate layer located in each of the second regions, a LOCOS oxide film is formed in the recess by a LOCOS technique, the LOCOS oxide film is formed so that a surface of the LOCOS oxide film becomes at the same height as that of a surface of a film stacked over the active region, and part of the substrate layer is separated along a peeling layer formed by ion-implanting a peeling material, thereby removing the part of the substrate layer with the peeling layer.

Moreover, another semiconductor device includes a substrate layer including a plurality of first regions each having an active region and a plurality of second regions each being provided between adjacent ones of the first regions. In the semiconductor device, a LOCOS oxide film formed by a LOCOS technique is provided in each of the second regions, the LOCOS film is formed so that a surface of the LOCOS film becomes at the same height as that of a surface of a film stacked over the active region, and part of the substrate layer is separated along a peeling layer formed by ion-implanting a peeling material, thereby removing the part of the substrate layer with the peeling layer.

Moreover, another semiconductor device includes a substrate layer including a plurality of first regions each having an active region and a plurality of second regions each being provided between adjacent ones of the first regions. In the semiconductor device, a recess is formed in a surface of part of the substrate layer located in each of the second regions, an isolation insulation film is filled in the recess, the isolation insulation film is formed so that a surface of the isolation insulation film becomes at the same height as that of a surface of a film stacked over the active region, and part of the substrate layer is separated along a peeling layer formed by ion-implanting a peeling material, thereby removing the part of the substrate layer with the peeling layer.

A semiconductor device according to an example embodiment may further include a flattening film for covering part of the substrate layer located in each of the first regions and the LOCOS oxide film, and a substrate may be bonded to a surface of the flattening film.

A semiconductor device according to an example embodiment may further include a flattening film for covering part of the substrate layer located in each of the first regions and the LOCOS oxide film, and a substrate may be bonded to a surface of the flattening film.

It is preferable that the substrate is a glass substrate.

The substrate layer may be a silicon layer.

It is preferable that the peeling material is hydrogen.

A MOS transistor may be formed in each of the first regions.

It is preferable that the film covering the active region is a gate oxide film, and a gate electrode of the MOS transistor is formed on a surface of the gate oxide film.

It is preferable that a MOS transistor is formed in each of the first regions, the film covering the active region is a gate oxide film, a gate electrode of the MOS transistor is formed on a surface of the gate oxide film, and a gate interconnect layer is formed in the isolation insulation film so as to be connected to the gate electrode.

A MOS transistor may be formed in each of the first regions, the film covering the active region may be a gate oxide film, a gate electrode of the MOS transistor may be formed on a surface of the gate oxide film, and a gate interconnect layer may be formed in the LOCOS oxide film so as to be connected to the gate electrode.

Effects

Next, effects of the present technology will be described.

According to a method for fabricating a semiconductor device according to an example embodiment, for example, in a recess formation step, a recess is formed in a surface of part of a substrate layer located in each of second regions. Subsequently, in an isolation insulation film formation step of forming a LOCOS oxide film or the like, an isolation insulation film such as a LOCOS oxide film or the like is formed in the recess, thereby forming an insulation isolation film such as a LOCOS oxide film or the like so that a surface of the LOCOS oxide film becomes the same height as that of a surface of a film covering the active region. Thereafter, in a peeling layer formation step, a peeling material is ion-implanted into the substrate layer. Thus, a peeling layer containing the peeling material is formed in the substrate layer. At this time, the surface of the film covering the active region in each of the first regions and the surface of the isolation insulation film such as the LOCOS oxide film or the like are at the same height, and therefore, an implantation depth in ion implantation can be set to be a small. Accordingly, ions of the peeling material can be implanted into the substrate layer uniformly to a certain depth with excellent controllability. As a result, ion implantation can be controlled in a simple manner to reliably form a peeling layer in the substrate layer.

Thereafter, in a separation step, part of the substrate layer is separated along the peeling layer formed in the peeling layer formation step. With use of a silicon layer as the substrate layer and hydrogen as the peeling material, the part of the substrate layer is preferably separated. In the above-described manner, an inventive semiconductor device is fabricated.

By the way, if a LOCOS oxide film is formed in a surface of a planer substrate layer by a LOCOS technique, for example, as shown in FIG. 33, a LOCOS oxide film 112 is grown to upward and downward from the surface of a substrate 101, so that a bird's beak 120 is formed in a peripheral portion of the LOCOS oxide film 112. The thickness of the bird's beak 120 decreases in the direction from a second region to a first region and has a cross-sectional shape like a beak of a bird. As can be seen, the bird's beak 120 does not have a sufficient thickness and thus does not have the function of reliably providing isolation between the first regions from one another. Therefore, in view of reducing the size of an entire device, it is preferable that the length of the bird's beak 120 (a length thereof in the direction from a second region to a first region) is as small as possible.

In contrast, a recess is formed beforehand on a surface of a substrate layer in which a LOCOS oxide film is to be formed by performing a recess formation step before a LOCOS oxide film formation step. Thus, a LOCOS oxide film can be formed in the recess so that a surface of the LOCOS oxide film is the same height as that of a surface of the film covering an active region. That is, the thickness of the LOCOS oxide film can be reduced to about half of the thickness of a LOCOS oxide film formed on a planar substrate surface. Therefore, the length of a bird's beak can be reduced according to the reduction in the thickness of the LOCOS oxide film.

Moreover, according to a method for fabricating a semiconductor device according to an example embodiment, in a LOCOS oxide film formation step, a LOCOS oxide film is formed in each of second regions of a substrate layer by a LOCOS technique. Subsequently, a flattening step is performed to the LOCOS oxide film. Thus, a surface of the LOCOS oxide film becomes at the same height as that of a surface of a film covering an active region. Thereafter, in the same manner as in each of the methods described above, a peeling layer formation step and a separation step are performed. Accordingly, as in each of the methods described above, ion implantation can be controlled in a simple manner to reliably form a peeling layer in the substrate layer.

Moreover, according to a method for fabricating a semiconductor device according to an example embodiment, a recess is formed beforehand in a surface of part of a substrate layer located in each of second regions, a recess is filled by an insulation isolation film, and then the isolation insulation film is flattened. Thus, a surface of the isolation insulation film becomes at the same height as that of a surface of a film covering an active region.

Accordingly, as in each of the methods described above, ion implantation can be controlled in a simple manner to reliably form a peeling layer in the substrate layer.

Moreover, in a flattening film formation step, a flattering film covering part of a substrate layer located in each of first regions and an isolation insulation film or a LOCOS oxide film. In a bonding step which is to be performed before the separation step, a substrate is bonded to the flattening film.

Furthermore, for example, in the part of the substrate layer located in each of first regions, a gate electrode of a MOS transistor is formed. In a LOCOS oxide film, a gate interconnect layer is formed so as to be connected to the gate electrode of the MOS transistor. A conduction section formation step of forming a conduction section to be connected to a source or drain region of the MOS transistor is performed before or after the bonding step.

DESCRIPTION OF THE PREFERRED EMBODIMENTS

Hereafter, example embodiments will be described with reference to the accompanying drawings. Note that the present invention is not limited to the following embodiments.

Embodiment 1

FIGS. 1 through 14 are cross-sectional views of a semiconductor device according to example Embodiment 1 illustrating respective steps for fabricating the semiconductor device.

In this embodiment, for the purpose of simplification, a single NMOS transistor will be described. Although description of a PMOS transistor will be not given herein, with appropriately change of the conduction type of an impurity in ion implantation, a PMOS transistor can be formed in the same manner. Moreover, the semiconductor device has the structure in which a plurality of NMOS transistors and a plurality of PMOS transistors are formed on the same semiconductor substrate.

Figure 1:
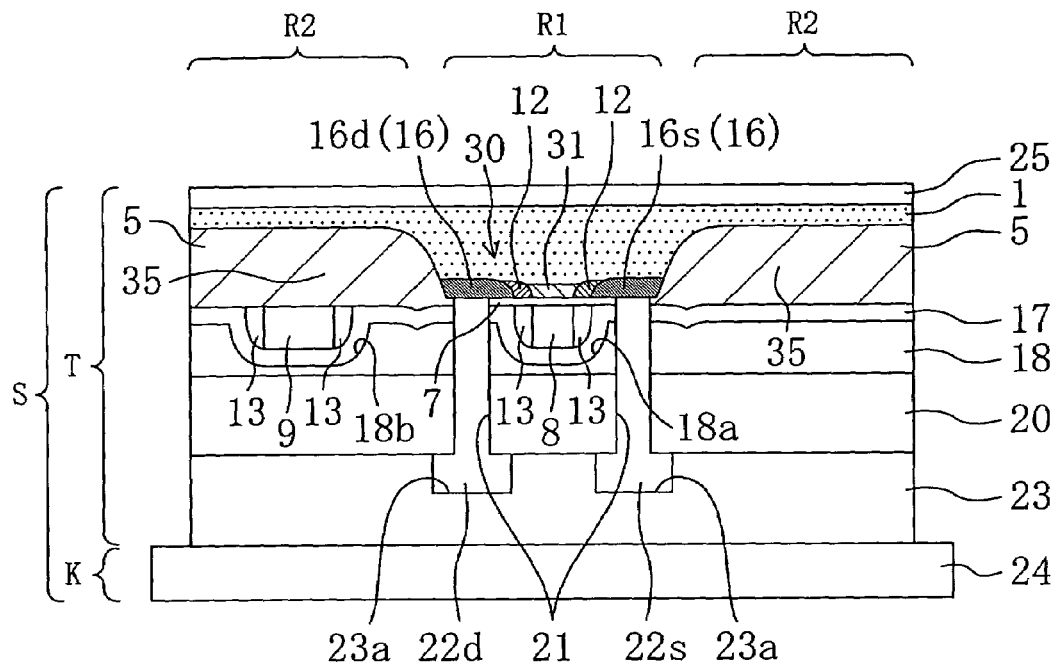
FIG. 1 is a cross-sectional view illustrating a semiconductor device according to example Embodiment 1.

FIG. 1 is a cross-sectional view schematically illustrating a semiconductor device S. The semiconductor device S includes a substrate K and a semiconductor device section T formed in high density and with high accuracy. The semiconductor device section T includes an NMOS transistor. One or a plurality of NMOS transistors are provided on the substrate K.

The substrate K is a glass substrate 24.

The semiconductor device section T includes a protection film 25, a substrate layer 1, an active region 30, a LOCOS oxide film 5, a gate oxide film 7, a gate electrode 8, a gate interconnect layer 9, a sidewall 13, interlayer insulation films 17, 18 and 20, a source electrode 22s, a drain electrode 22d and an insulation film 23, and forms a MOS transistor (NMOS transistor) having a LDD (lightly doped drain) structure including a channel region 31 and a lightly impurity doped region 12.

Specifically, as shown in FIG. 1, the insulation film 23 is stacked on the glass substrate 24. A third interlevel insulation film 20, a second interlevel insulation film 18 and a first interlevel insulation film 17 are stacked in this order on the insulation film 23. Furthermore, a silicon layer 1, i.e., the substrate layer 1 is stacked on the first interlevel insulation film 17 with the LOCOS oxide film 5 and the gate oxide film 7 interposed therebetween. On the silicon layer 1, the protection film 25 is provided. Silicon used for the substrate layer 1 is just an example and any other material which can form a semiconductor layer may be used.

The gate electrode 8 is formed between the first interlevel insulation film 17 and the gate oxide film 7. Specifically, as shown in FIG. 1, a concave portion 18a is formed in the second interlevel insulation film 18. The first interlevel insulation film 17 is formed along a surface of the concave portion 18a and thus has a concave shape. The gate electrode 8 is provided in the concave portion 18a with the first interlevel insulation film 17 interposed therebetween. Moreover, sidewalls 13 are formed on right and left side surfaces of the gate electrode 8, respectively. The sidewalls 13 and an upper surface of the gate electrode 8 form a plane with respective upper surfaces of the first interlevel insulation film 17 and second regions R2 (detail description of which will be later described).

Moreover, as shown in FIG. 1, a recess 18b is formed in the second interlevel insulation film 18, and the first interlevel insulation film 17 is formed along a surface of the recess 18b to have a recess shape. The gate interconnect layer 9 is formed in the recess 18b with the first interlevel insulation film 17 interposed therebetween and is connected to the gate electrode 8.

Then, the silicon layer 1 is provided over the first interlevel insulation film 17, the gate electrode 8 and the gate interconnect layer 9. The silicon layer 1 includes, as shown in FIG. 1, a plurality of first regions R1 in which an active region 30 is formed and a plurality of second regions R2 each being provided between adjacent ones of the first regions R1.

The active regions 30 includes a channel region 31 formed over the gate electrode 8, a lightly impurity doped region 12 formed over the sidewall 13 so as to be located outside of the channel region 31 and a heavily impurity doped region 16 formed outside of the lightly impurity doped region 12.

A p-type impurity element such as boron is implanted into the channel region 31 at a concentration of about $1\text{-}5\times10^{17}$ cm$^{-3}$. An n-type impurity element such as phosphorus is implanted into the lightly impurity doped region 12 and the heavily impurity doped region 16 so that the lightly impurity doped region 12 has a lower impurity concentration than that of the heavily impurity doped region 16. For example, the lightly impurity doped region 12 has an impurity concentration of about $1\text{-}5\times10^{18}$ cm$^{-3}$ and the heavily impurity doped region 16 has an impurity concentration of about $1\times10^{19}$ to $1\times10^{20}$ cm$^{-3}$. That is, the impurity concentration in the active region 30 increases in the order of the channel region 31, the lightly impurity doped region 12, and the heavily impurity doped region 16.

One part of the heavily impurity doped region 16 forms a drain region 16d and the other part of the heavily impurity doped region 16 forms a source region 16s. Furthermore, a drain electrode 22d is connected to the drain region 16d and a source electrode 22s is connected to the source region 16s.

Specifically, as shown in FIG. 1, contact holes 21 are formed under the drain region 16d and the source region 16s, respectively, so that each of the contact holes 21 vertically passes through the gate oxide film 7, the first interlevel insulation film 17, the second interlevel insulation film 18 and the third interlevel insulation film 20. Also, concave recesses 23a are formed in the insulation film 23 so that each of the concave recesses 23a continues an associated one of the contact holes 21. Thus, a conductive material such as metal is filled in the contact holes 21, thereby forming the drain electrode 22d and the source electrode 22s, and a conductive material is filled in the concave recesses 23a, thereby forming drain and source interconnects.

On a lower surface of part of the silicon layer 1 located in each of the first regions, the gate oxide film 7 serving as an insulation film is stacked. In other words, the gate oxide film 7 is provided between the silicon layer 1 and each of the gate electrode 8, the sidewall 13 and the first interlevel insulation film 17. That is, the gate electrode 8 is formed under the gate oxide film 7.

On the other hand, a recess 35 is formed in a lower surface of part of the silicon layer 1 located in each of the second regions R2. The recess 35 is formed so as to spread entirely in each of the second regions R2. In the recess 35, the LOCOS oxide film 5 is formed using a LOCOS technique. A surface (lower surface in this example) of the LOCOS oxide film 5 is at the same height as that of the surface (lower surface in this example) of the gate oxide film 7. The gate interconnect layer 9 is formed on the surface of the LOCOS oxide film 5. The LOCOS oxide film 5 as well as the part of the silicon layer 1 located in each of the first regions R1 are covered by the insulation film 23 as a flattening film with the second interlevel insulation film 18 and the third interlevel insulation film 20 interposed therebetween.

Upper part of the silicon layer 1 (located in the other side thereof to a side thereof on which the active region 30 is formed) is separated along a peeling layer (not shown) formed by implanting ions of a peeling material such as hydrogen. Thereafter, an upper surface of the silicon layer 1 is processed by mechanical polishing, etching or the like so as to have a further reduced film thickness.

The semiconductor device S, as has been described, has the structure in which a MOS transistor is formed in part of the silicon layer 1 located in each of the first regions R1. The semiconductor device S may have the structure in which the semiconductor device section T is reversed upside down with respect to the glass substrate 24.

Fabrication Method

Next, a method for fabricating the semiconductor device S according to the an example embodiment will be described with reference to FIGS. 1 through 14.

A fabrication method according to this embodiment includes a recess formation step, a LOCOS oxide film (isolation insulation film) formation step, an ion implantation step, a gate electrode formation step, a gate interconnect layer formation step, an activation step, an interlevel insulation film flattening step, a peeling layer formation step, a conduction section formation step, a flattening film formation step, a bonding step, and a separation step.

Figure 2:
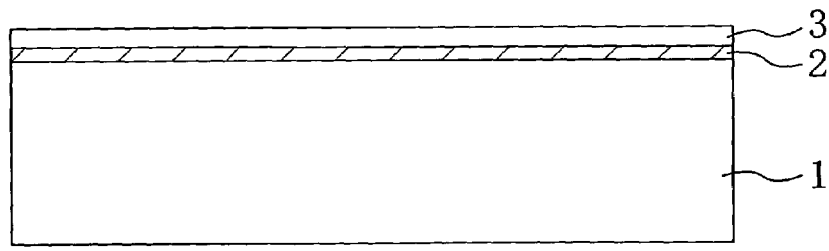
FIG. 2 is a cross-sectional view illustrating how a nitride film is formed in a recess formation step.
Figure 3:
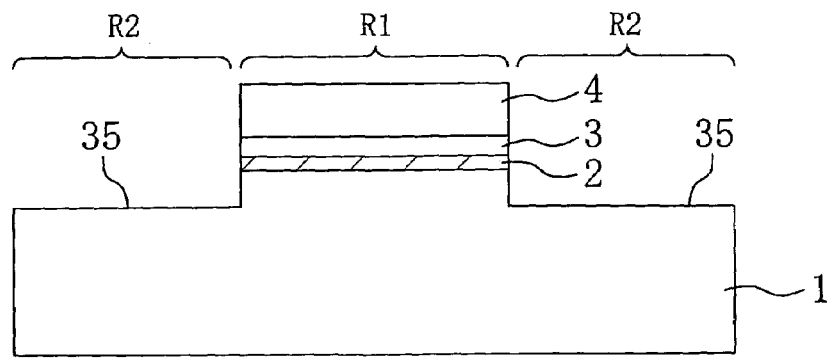
FIG. 3 is a cross-sectional view illustrating how a recess is formed in the recess formation step.

First, in the recess formation step, as shown in FIGS. 2 and 3, a recess 35 is formed beforehand in part of a surface of the silicon substrate 1 located in each of the second regions R2. For formation of the recess 35, as shown in FIG. 2, first, high-temperature heat treatment is performed to the silicon substrate 1 in an oxygen atmosphere at a temperature of about 1000° C. to form a thermal oxide film 2 having a thickness of about 30 nm. Subsequently, a nitride film 3 is formed by CVD or the like so as to have a thickness of about 200 nm.

Thereafter, as shown in FIG. 3, for formation of a LOCOS oxide film, which will be described later, with a resist 4 as a mask, the nitride film 3 and the thermal oxide film 2 are patterned and the silicon substrate 1 is etched by about 80 nm, thereby forming a recess 35. Specifically, in this manner, the part of the silicon substrate 1 located in each of the first regions R1 is masked and thus not etched, but the part of the silicon substrate 1 located in each of the second regions R2 is etched.

Figure 4:
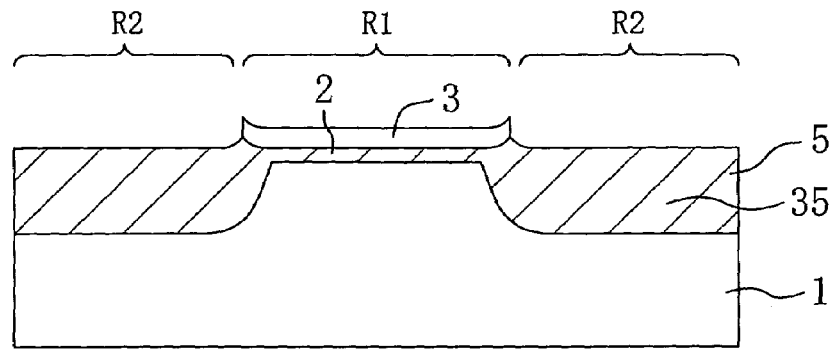
FIG. 4 is a cross-sectional view illustrating a LOCOS oxide film formation step.

Next, in the LOCOS oxide film formation step, as shown in FIG. 4, a LOCOS oxide film serving as an isolation insulation film is formed in the recess 35 by a LOCOS technique so that a surface of the LOCOS oxide film is at the same height as that of a surface of the thermal oxide film 2 (i.e., a surface of a gate oxide film 7 to be formed later). Specifically, after the resist 4 has been removed, with the nitride film 3 as a mask, thermal oxidation is performed in an oxygen atmosphere by high-temperature heat treatment. Thus, a LOCOS oxide film 5 for device isolation is formed so as to have a thickness of about 200 nm. In this process step, the thickness of part of the silicon layer 1 consumed by oxidation corresponds to about 45% of the thickness of the LOCOS oxide film 5. Therefore, a surface of the resultant LOCOS oxide film 5 can be made to be approximately at the same height as that of the surface of the thermal oxide film 2. Part of the LOCOS oxide film 5 which is in contact with the nitride film 3 is slightly lifted along the nitride film 3. However, the height of the lifted part is low and effect on ion implantation is small. Therefore, the lifted part of the LOCOS oxide film 5 does not cause a problem.

Figure 5:
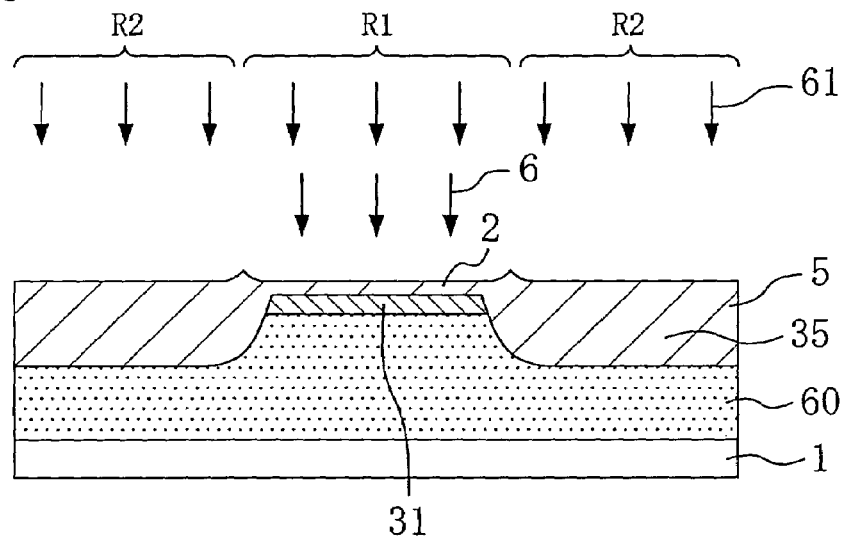
FIG. 5 is a cross-sectional view illustrating a first ion implantation step.

Subsequently, the first ion implantation step is performed. In this process step, as shown in FIG. 5, the nitride film 3 is removed, and then a p-type well 60 is formed. Therefore, an impurity element 61 is introduced into the silicon substrate 1 by ion implantation. The impurity element 61 is, for example, a boron element, and is implanted at an implantation energy of 50-200 KeV and a dose of about $1-10 \times 10^{12}$ cm$^{-2}$. Ion implantation for forming the p-type well 60 may be performed multiple times with implantation energy and dose being properly changed. Next, to adjust a threshold voltage of an NMOS transistor, an impurity element 6 is introduced into an NMOS transistor formation region (i.e., part of the silicon substrate 1 which is to be an active region 30) by ion implantation or the like. The impurity element 6 is, for example, a boron element, and is implanted at an implantation energy of 10-30 KeV and a dose of about $1-5 \times 10^{12}$ cm$^{-2}$. The p-type well formation step is not necessary and therefore may be omitted.

Next, the gate electrode formation step and the gate interconnect layer formation step are performed. In the process steps, a gate electrode 8 of a MOS transistor is formed on the surface of the gate oxide film 7, and a gate interconnect layer 9 to be connected to the gate electrode 8 of the MOS transistor is formed on the LOCOS oxide film 5.

Figure 6:
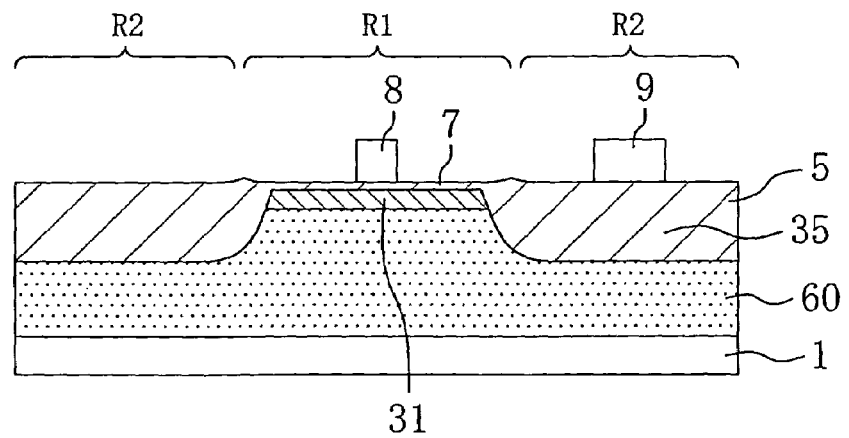
FIG. 6 is a cross-sectional view illustrating a gate electrode formation step and a gate interconnect layer formation step.

As shown in FIG. 6, the thermal oxide film 2 located on the NMOS transistor formation region (which is to be the active region 30 later) and having a thickness of about 30 nm is removed by wet etching or the like, and then heat treatment is performed at a temperature of about 1000° C. in an oxygen atmosphere, thereby forming the gate oxide film 7 having a thickness of about 10-20 nm on the silicon substrate 1. Accordingly, the respective surfaces of the gate oxide film 7 and the LOCOS oxide film 5 become approximately at the same height.

Subsequently, polysilicon is formed by CVD or the like on the surfaces of the gate oxide film 7 and the LOCOS oxide film 5 so as to have a thickness of about 200-300 nm. An n-type impurity such as phosphorus is diffused in the polysilicon layer or introduced into the polysilicon layer by ion implantation or the like, thereby forming an n-type polysilicon layer. Thereafter, the n-type polysilicon layer is patterned by photolithography and etching, so that the gate electrode 8 is formed on the gate oxide film 7 and the gate interconnect layer 9 is formed on the LOCOS oxide film 5. The gate electrode 8 and the gate interconnect layer 9 are simultaneously formed.

Figure 7:
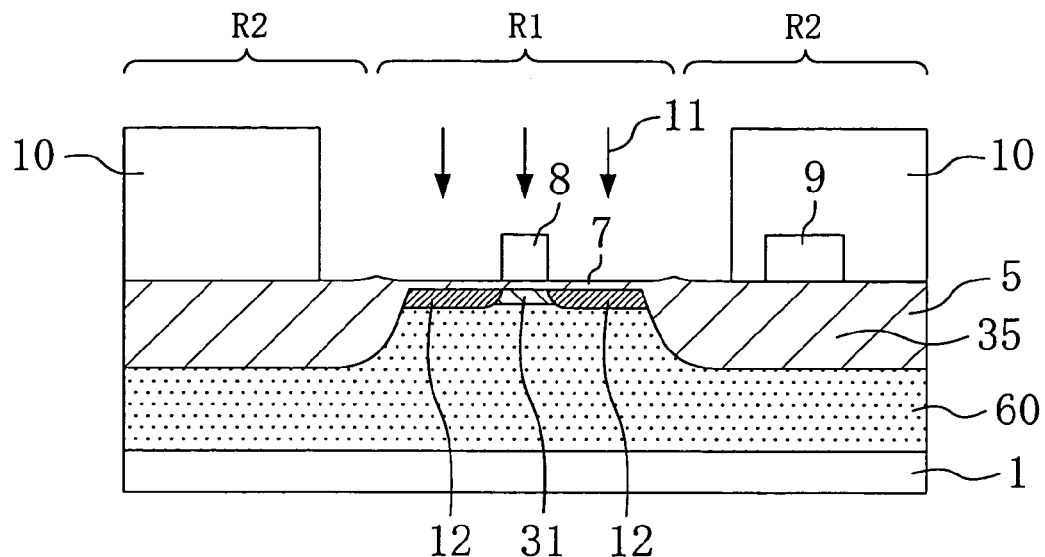
FIG. 7 is a cross-sectional view illustrating a second ion implantation step.

Next, a second ion implantation step is performed. In this process step, as shown in FIG. 7, a resist 10 is formed so as to have an opening corresponding to at least the NMOS transistor formation region (the active region 30 to be described later), and then, with the gate electrode 8 as a mask, an n-type impurity 11 is ion-implanted. Thus, a lightly impurity doped region 12 is formed. The n-type impurity 11 is, for example, a phosphorus element. For a condition of the ion implantation, for example, a dose is about $5 \times 10^{12}$ to $5 \times 10^{13}$ cm$^{-2}$.

Figure 8:
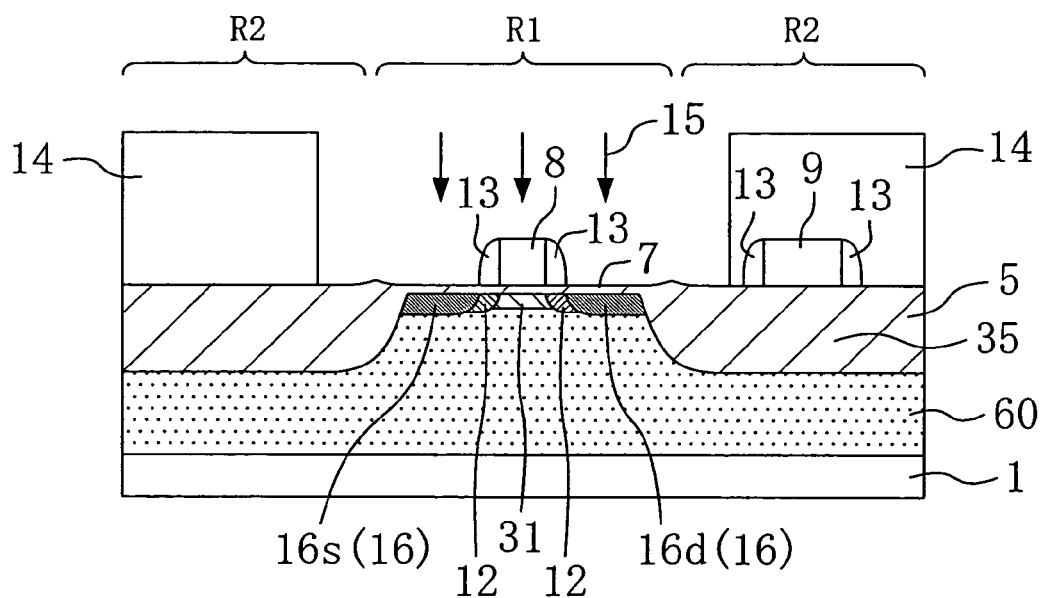
FIG. 8 is a cross-sectional view illustrating a third ion implantation step.

Subsequently, a third ion implantation step is performed. In this process step, as shown in FIG. 8, the resist 10 is removed, and then a sidewall 13 of SiO$_2$ or the like is formed on each of side wall parts of the gate electrode 8 and the gate interconnect layer 9. Thereafter, a resist 14 is formed so as to have an opening corresponding to at least the NMOS transistor formation region (the active region 30 to be described later), and then, with the gate electrode 8 and the sidewall 13 as a mask, an n-type impurity 15 is ion-implanted. Thus, a heavily impurity doped region 16 is formed.

Figure 9:
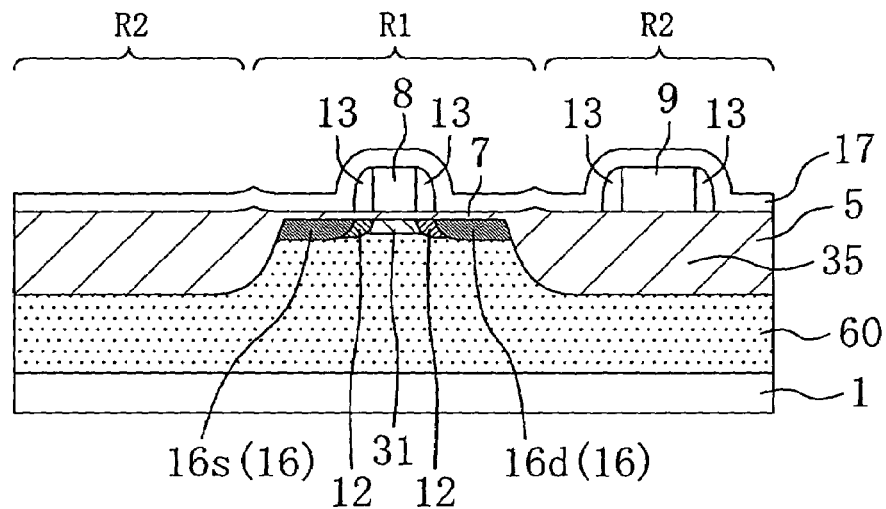
FIG. 9 is a cross-sectional view illustrating an activation step.

Thereafter, in the activation step, as shown in FIG. 9, a first interlevel insulation film 17 is formed so as to have a thickness of about 100 nm, and then heat treatment is performed to activate the impurity element introduced into the silicon substrate 1 by ion implantation or the like. For example, heat treatment is performed at 900° C. for 10 minutes. Thus, the active region 30 is formed.

Figure 10:
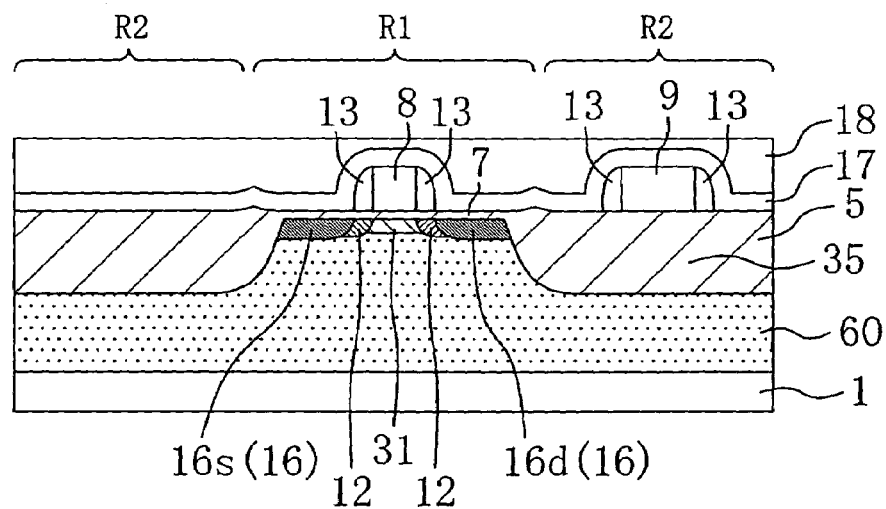
FIG. 10 is a cross-sectional view illustrating an interlevel insulation film flattening step.

Next, the interlevel insulation film flattening step is performed. In this process step, as shown in FIG. 10, a second interlevel insulation film 18 is deposited over the first interlevel insulation film 17, and then a surface of the second interlevel insulation film 18 is flattened, for example, by CMP (chemical mechanical polishing) or the like. A method for flattening the surface is not limited to CMP. Also, in the activation step, the first interlevel insulation film 17 may be formed beforehand so as to have a large thickness, and then the surface thereof may be flattened by CMP or the like so that formation of the second interlevel insulation film 18 can be omitted.

Figure 11:
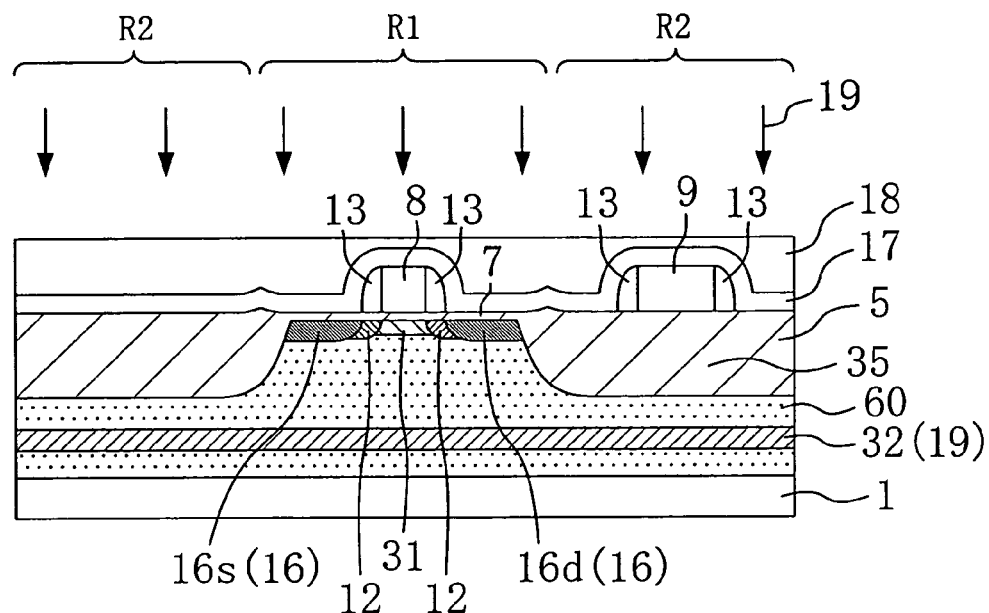
FIG. 11 is a cross-sectional view illustrating a peeling layer formation step.

Subsequently, in the peeling layer formation step, as shown in FIG. 11, a hydrogen element 19 serving as a peeling material is introduced into the silicon substrate 1 by ion implantation. For implantation condition, for example, a dose is $1\text{-}5\times10^{16}$ cm$^{-2}$ and an implantation energy is 50-200 KeV. Not only the hydrogen element 19 but also some other element may be introduced with the hydrogen element 19 into the silicon substrate 1. In this process step, since the gate electrode 8 and the gate interconnect layer 9 are formed so as to be at the same height and the thickness of the second interlevel insulation film 18 can be reduced. Therefore, an ion implantation depth may be relatively small. Accordingly, variations in implantation can be reduced, so that ions of each impurity element can be relatively accurately implanted to a certain depth from the surface of the silicon substrate 1. Thus, in the silicon substrate 1, the peeling layer 32 serving as a hydrogen-implanted layer is formed. In this embodiment, the peeling layer formation step is performed after the LOCOS oxide film formation step.

Figure 12:
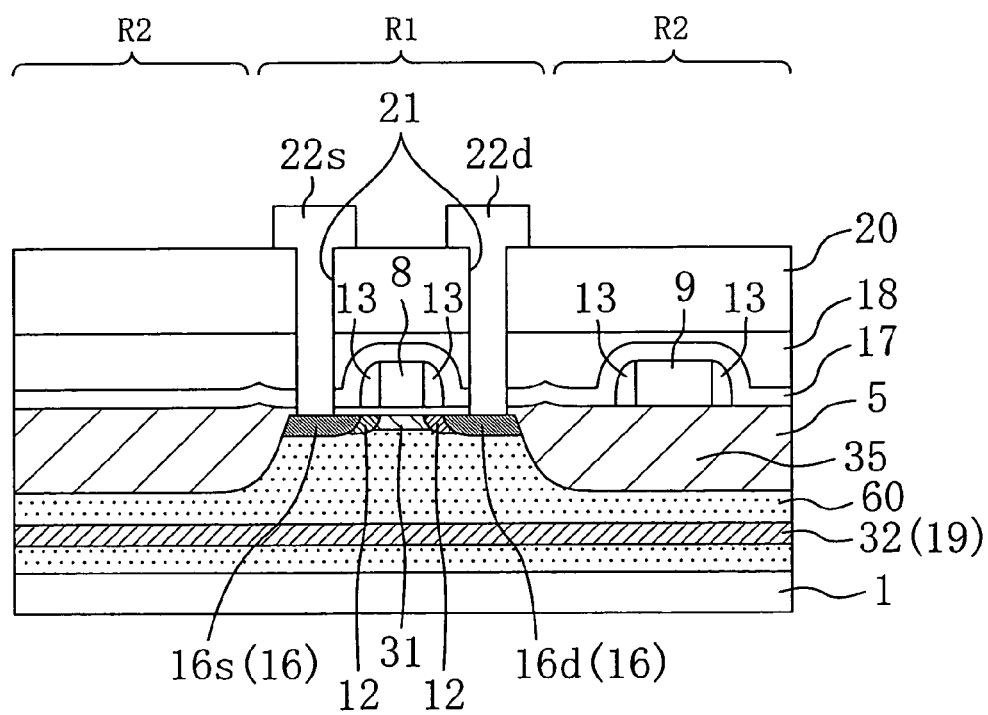
FIG. 12 is a cross-sectional view illustrating a conduction section formation step.

Thereafter, in the conduction section formation step, conduction sections 22d and 22s are formed so that each of the conduction sections 22d and 22s is connected to a source region or a drain region of the MOS transistor. Specifically, as shown in FIG. 12, the third interlevel insulation film 20 is formed on a surface of the second interlevel insulation film 18. Furthermore, contact holes 21 are formed over a drain region 16d and a source region 16s of the active region 30, respectively, so that each of the contact holes 21 vertically passes through the gate oxide film 7 and the first, second and third interlevel insulation films 17, 18 and 20. Next, by depositing a metal electrode material and then performing patterning, a conductive material is filled in each of the contact holes 21, and a drain electrode 22d and a source electrode 22s each serving as a conduction section are formed.

Figure 13:
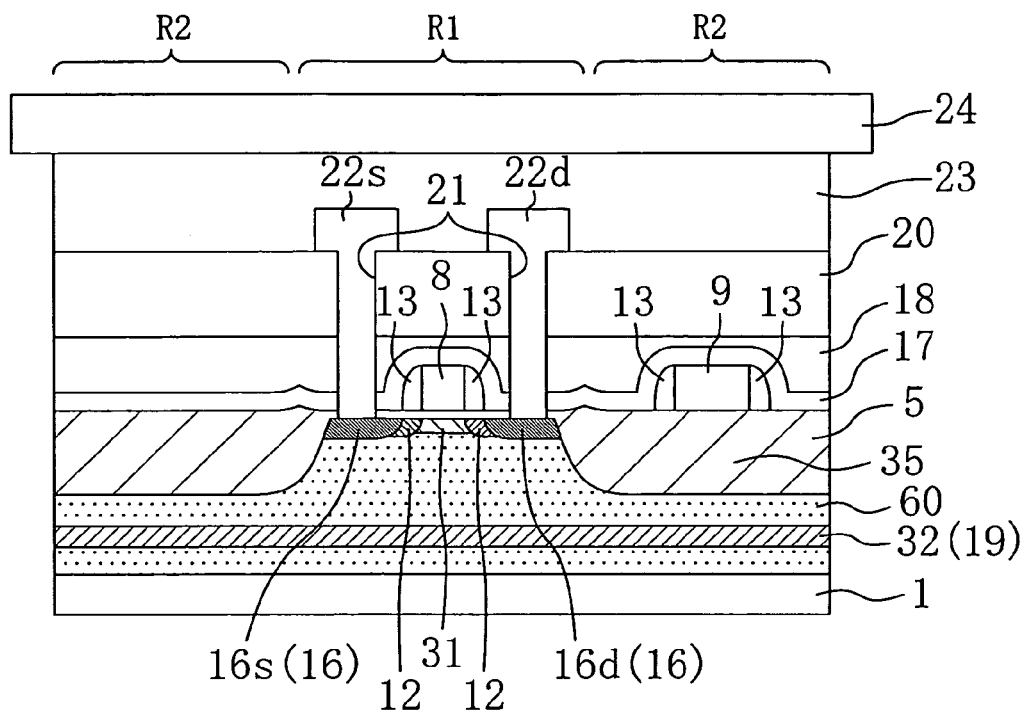
FIG. 13 is a cross-sectional view illustrating a flattening film formation step and a bonding step.

Next, in the flattening film formation step, as shown in FIG. 13, an insulation film 23 is formed on the third interlevel insulation film 20, and then a surface of the insulation film 23 is flattened by CMP or the like. Thus, the part of the silicon layer 1 located in each of the first regions R1 and the LOCOS oxide film 5 are covered by the insulation film 23 serving as a flattening film.

Subsequently, in the bonding step, the silicon substrate 1 is divided by dicing or the like so that each divided portion has a desired size and the surface of the insulation film 23 is cleaned by RCA cleaning or the like. Then, a glass substrate 24 is bonded to the surface of the insulation film 23. Thus, in this embodiment, the bonding step is performed after the conduction section formation step.

Figure 14:
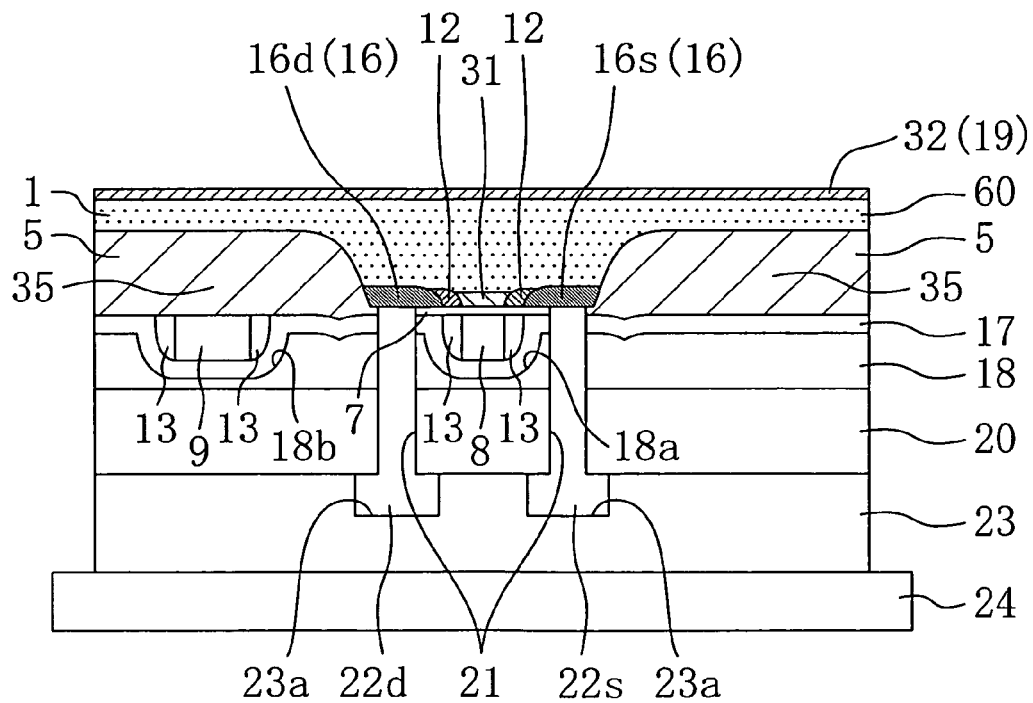
FIG. 14 is a cross-sectional view illustrating a separation step.

Next, in the separation step, as shown in FIG. 14, heat treatment is performed at about 600° C., thereby separating part of the silicon substrate 1 (i.e., part of the silicon substrate 1 located in the other side thereof to a side thereof on which the active region 30 is formed with the peeling layer 32 interposed therebetween) along the peeling layer 32 for removal. As a result, other part of the silicon substrate 1 is left as the silicon layer 1 on the glass substrate 24. Accordingly, a semiconductor device section T formed on the silicon substrate 1 is moved to the glass substrate 24. Thus, in this embodiment, the separation step is performed after the bonding step.

Thereafter, as shown in FIG. 1, part of the silicon layer 1 containing the hydrogen element 19 (i.e., part of the peeling layer 32) is removed by etching or the like. As the etching, dry etching, wet etching, or combination of dry etching and wet etching may be performed. However, if only dry etching is performed, etching damage might be created on the surface of the silicon layer 1. Therefore, it is preferable that after dry etching, an appropriate wet etching is performed. Subsequently, to protect the surface of the silicon layer 1 from which the hydrogen element 19 has been removed, a protection film 25 such as an oxide film or the like is formed. Etching of the part of the silicon layer 1 containing the hydrogen element 19 may be continuously performed for device isolation until the LOCOS oxide film 5 is exposed. Moreover, etching of the part of the silicon layer 1 containing the hydrogen element 19 may be continuously performed for device isolation until the active region 30 is exposed.

In the above-described manner, the semiconductor device S is fabricated.

Effects of Embodiment 1

Figure 15:
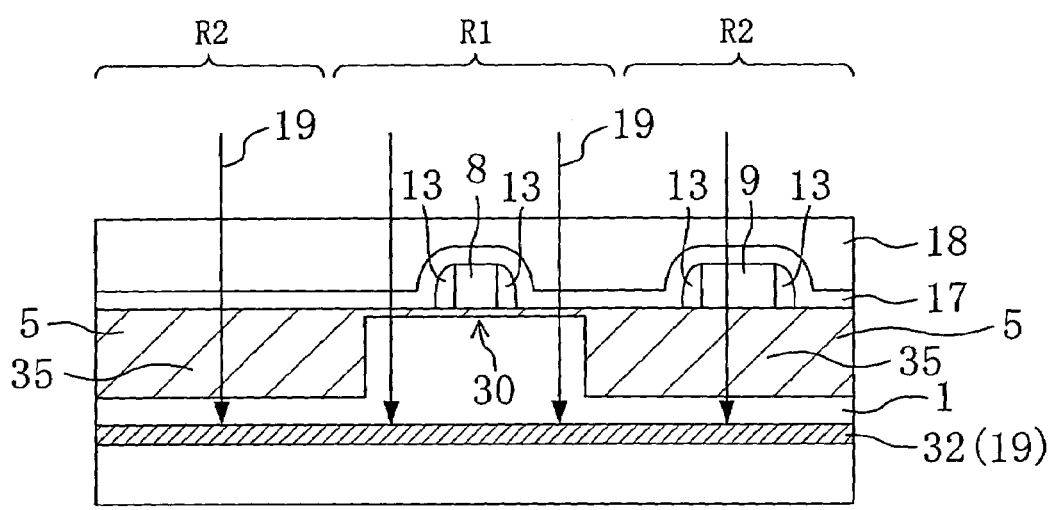
FIG. 15 is a schematic view illustrating hydrogen ion implantation.

According to Embodiment 1, the recess 35 is formed in each of the second regions R2 of the silicon substrate 1 and the LOCOS oxide film 5 is formed in the recess 35 in the second region R2 so that the surface of the LOCOS oxide film 5 is at the same height as that of the surface of the gate oxide film 7 on the active region 30. Therefore, as an arrow in the schematic view of FIG. 15 shows, the hydrogen 19 serving as a peeling material can be ion-implanted relatively uniformly into each of the first regions R1 and the second regions R2 to reach the same depth therein. As a result, ion implantation of the hydrogen 19 into the silicon layer 1 can be controlled in a simple manner, so that the peeling layer 32 can be accurately formed in the silicon layer 1 and part of the silicon layer 1 can be reliably separated.

Furthermore, by forming the recess 35 beforehand, the LOCOS oxide film 5 can be formed so as to have a thickness corresponding to half of the thickness of the LOCOS oxide film 5 formed on the planer silicon layer 1. Accordingly, the length of a bird's beak can be reduced, so that the area of the second regions necessary for device isolation can be reduced. As a result, a device such as a MOS transistor can be formed with high density, and thus the degree of integration of a semiconductor circuit can be increased.

Furthermore, a MOS transistor is formed not on the glass substrate 24 but on the silicon substrate 1. Therefore, processing at a higher temperature than the melting point of glass can be performed and a submicron device, which can not be formed directly on a glass substrate, can be formed. Moreover, in recent years, as a display area has been increased more and more, the size of glass substrates tends to be increased. A large size glass substrate is much larger than a silicon substrate. Therefore, CMP, which is performed on a silicon substrate, can not be applied thereto as it is. In contrast, in this embodiment, before bonding onto the glass substrate 24, flattening by CMP or the like can be performed on the silicon substrate 1 beforehand.

Moreover, flattening of the insulation film 18 on the gate electrode at a time point of hydrogen implantation is simplified and the thickness of the insulation film 18 can be reduced. Therefore, variation in the thickness of the insulation film 18 can be suppressed. In addition, the depth to which hydrogen is implanted can be made small. Thus, controllability over implantation depth is further improved, so that controllability over the thickness of the silicon layer can be improved.

In Embodiment 1, the case where the LOCOS technique is used as a method for device isolation has been described. However, by forming the first regions R1 and the second regions R2 so that the surfaces of the first and second regions R1 and R2 are at the same height using some other method (e.g., etch back, CMP flattening technique, trench isolation, and the like), the same effect can be also achieved.

Embodiment 2

Figure 16:
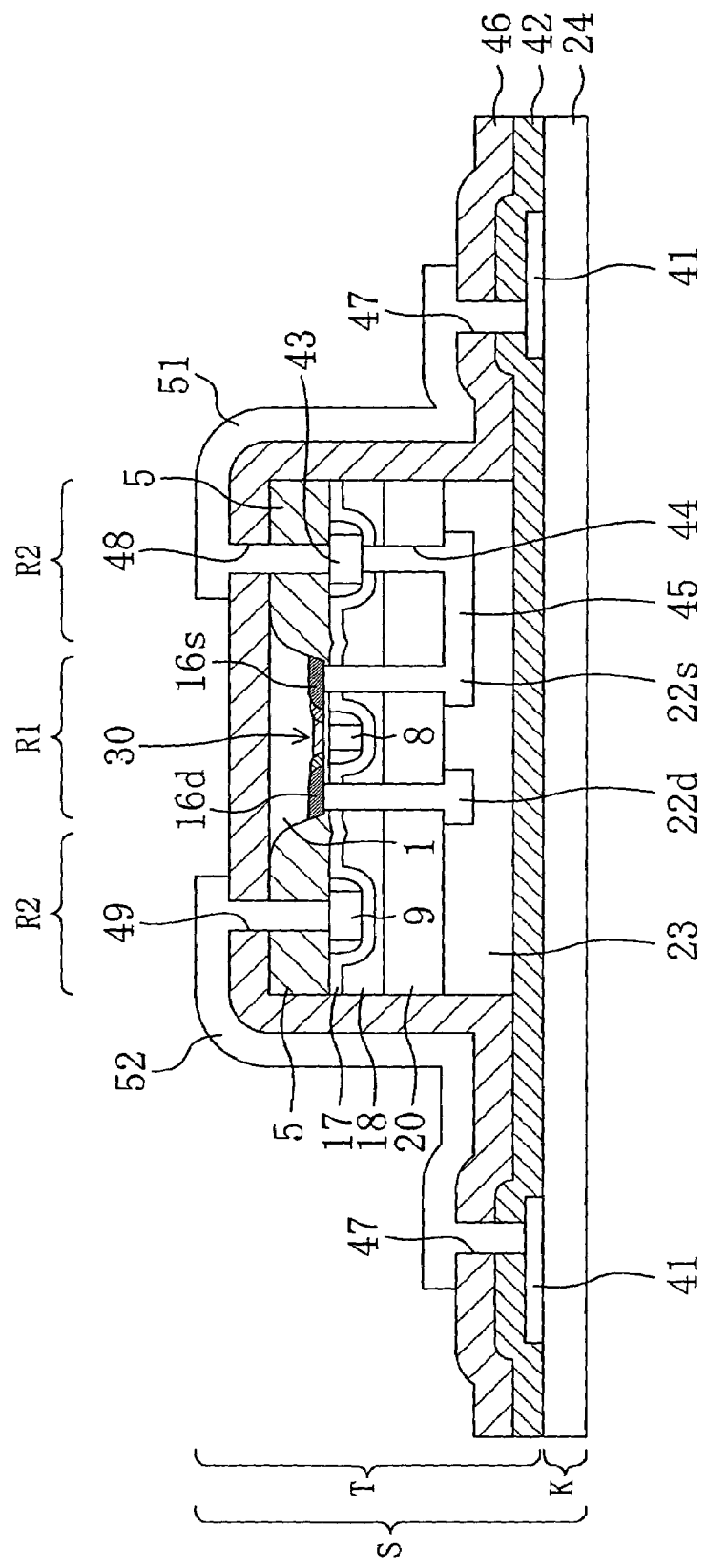
FIG. 16 is a cross-sectional view illustrating a semiconductor device according to example Embodiment 2.
Figure 17:
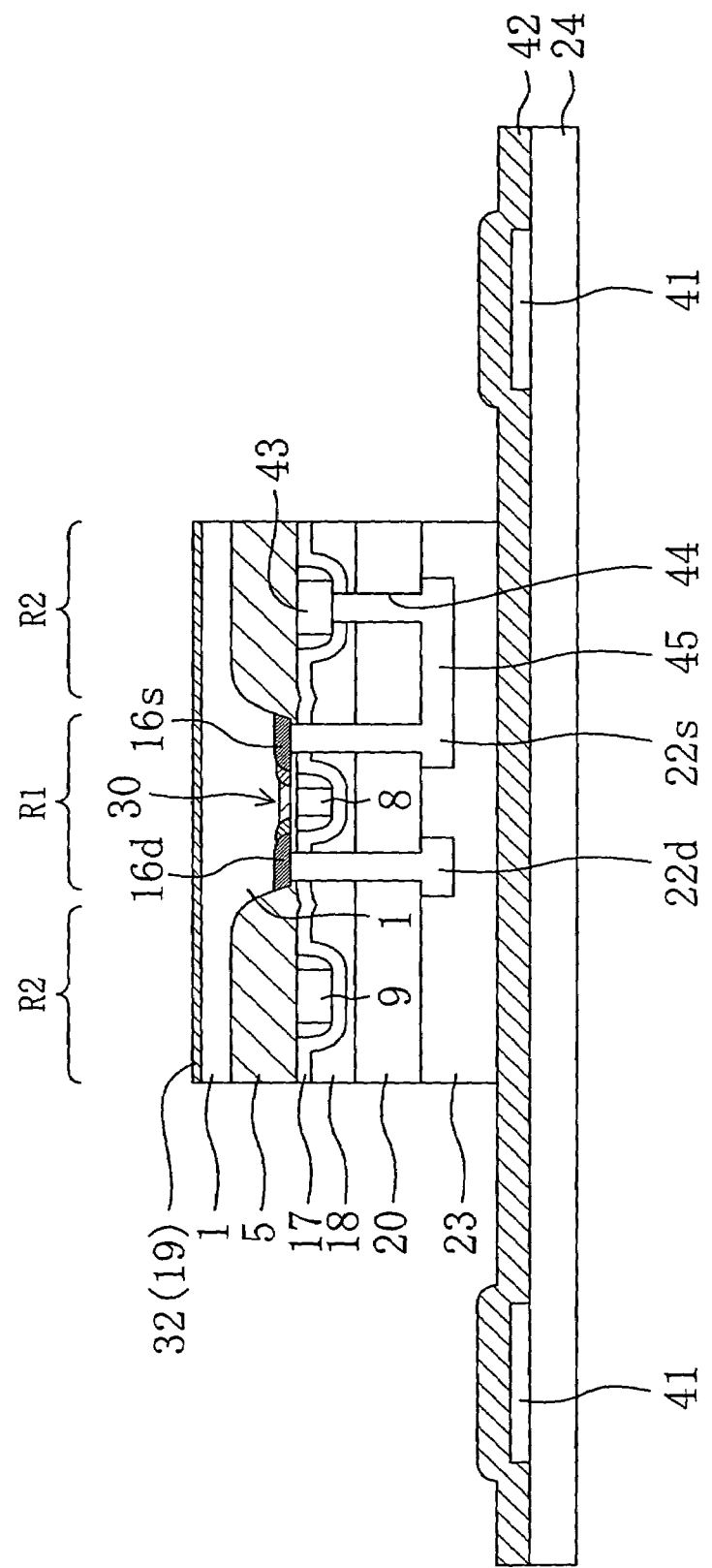
FIG. 17 is a cross-sectional view illustrating a bonding step.
Figure 18:
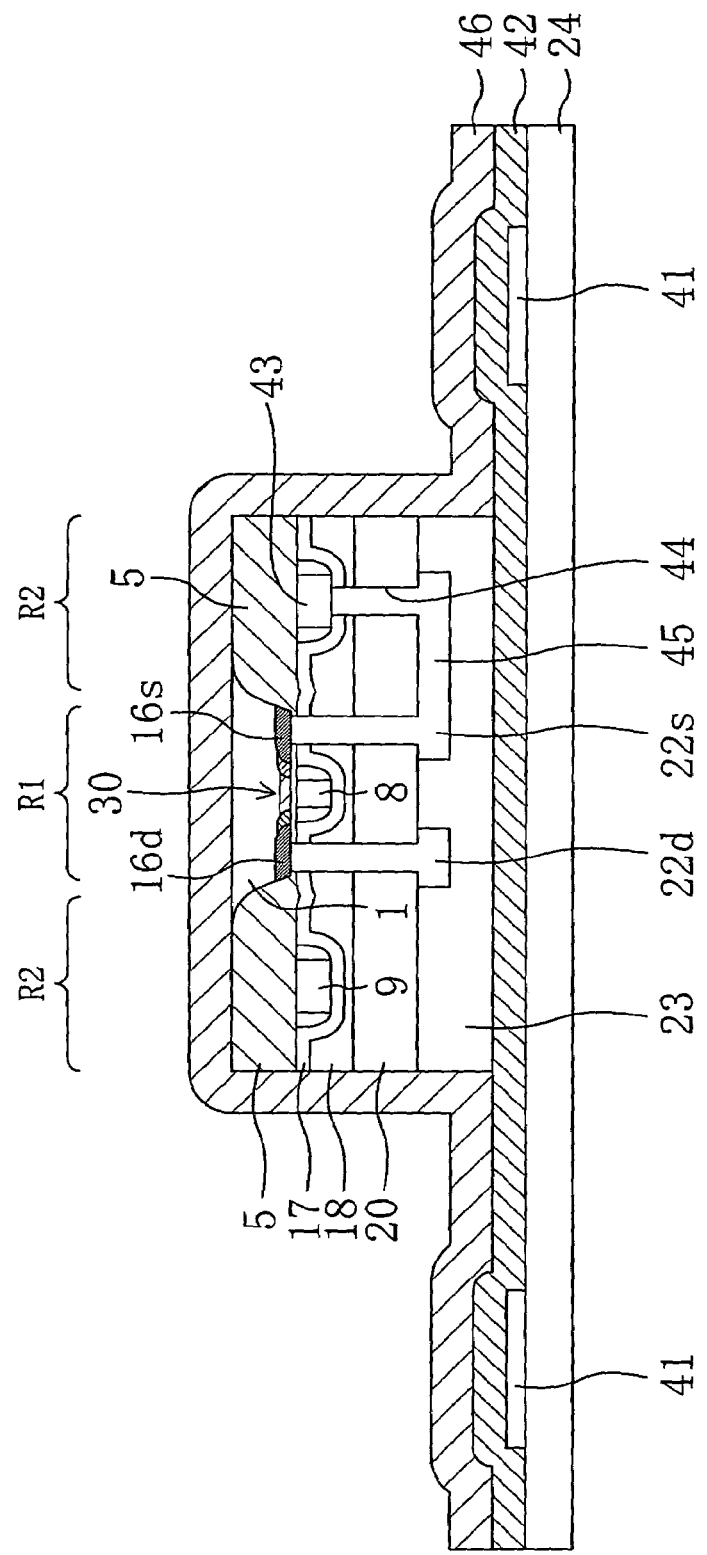
FIG. 18 is a cross-sectional view illustrating a removal step and a covering step.
Figure 19:
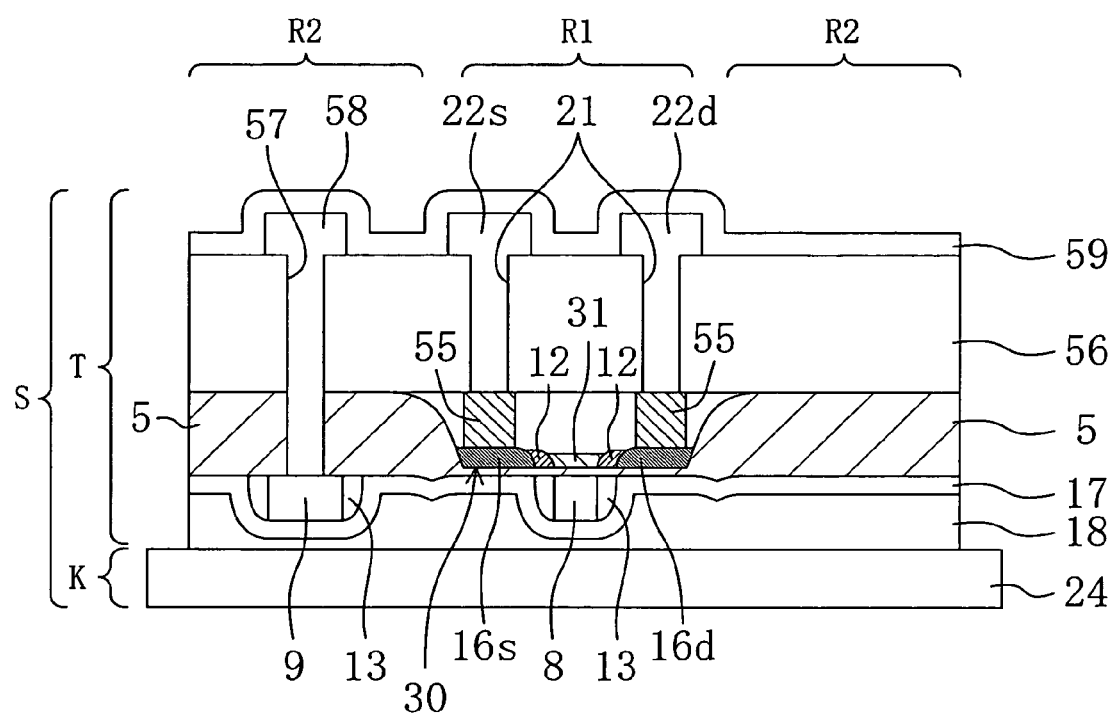
FIG. 19 is a cross-sectional view illustrating a semiconductor device according to example Embodiment 3.

FIGS. 16 through 18 are cross-sectional views illustrating a semiconductor device according to example Embodiment 2. Note that each member also shown in FIGS. 1 through 14 is identified by the same reference numeral and therefore the description thereof will be omitted.

In this embodiment, a semiconductor device S is connected to electric elements 41 formed beforehand on a glass substrate 24.

As shown in FIG. 16, the electric elements 41 are provided on the glass substrate 24. Each of the electric elements 41 is formed of, for example, an active element such as a thin film transistor, a resistance element, a capacitative element, a passive element such as a coil element, an interconnect or the like.

On the glass substrate 24, a fourth interlevel insulation film 42 such as $SiO_2$ covering the electric elements 41 is stacked. As in Embodiment 1, an insulation film 23, a third interlevel insulation film 20, a second interlevel insulation film 18, a first interlevel insulation film 17, a gate electrode 8, a gate interconnect layer 9, a LOCOS oxide film 5, and a silicon layer 1 including an active region 30 is formed on the fourth interlevel insulation film 42.

In this embodiment, an electrode layer 43 is formed in the same layer as the gate electrode 8 and the gate interconnect layer 9. The electrode layer 43 is formed in the same manner as the gate electrode 8 and the gate interconnect layer 9 are formed. The electrode layer 43 is connected to a source electrode 22s via a contact hole 44 and a metal electrode 45.

Moreover, part of the silicon layer 1 located in each of second regions R2 has been removed from the surface of the LOCOS oxide film 5. The fourth interlevel insulation film 42, the silicon layer 1, the LOCOS oxide film 5 and the like are covered by a fifth interlevel insulation film 46. The fifth interlevel insulation film 46 also covers side surfaces of the first, second and third interlevel insulation films 17, 18 and 20 and the insulation film 23.

Contact holes 47, 48 and 49 are formed over the electric elements 41, the electrode layer 43, and the gate interconnect layer 9, respectively. The contact hole 47 is formed over one of the electric elements 41 so as to vertically pass through the fourth interlevel insulation film 42 and the fifth interlevel insulation film 46. The contact hole 48 is formed over the electrode layer 43 so as to vertically pass through the LOCOS oxide film 5 and the fifth interlevel insulation film 46. The contact hole 49 is formed over the gate interconnect layer 9 so as to vertically pass through the LOCOS oxide film 5 and the fifth interlevel insulation film 46.

On the fifth interlevel insulation film 46, a first interconnect section 51 and a second interconnect section 52 are formed. The interconnect section 51 contacts one of the electric elements 41 and the electrode layer 43 through the contact hole 47 and the contact hole 48. On the other hand, the second interconnect section 52 connects the other one of the electric elements 41 and the gate interconnect layer 9 through the contact hole 47 and the contact hole 49.

In the above-described manner, the semiconductor device S is fabricated. Then, for example, a source signal is supplied from one of the electric elements 41 to a source region 16s in the active region 30 through the first interconnect section 51, the electrode layer 43, the metal electrode section 45 and the source electrode 22s. Moreover, for example, a gate signal is supplied from the other one of the electric elements 41 to the gate electrode 8 through the second interconnect section 52 and the gate interconnect layer 9.

Fabrication Method

Next, a method for fabricating the semiconductor S according to this embodiment will be described with reference to FIGS. 16 and 17.

The fabrication method of this embodiment includes the same steps as those from the recess formation step to the separation step of Embodiment 1 (FIGS. 2 through 14). Respective formation methods for the electrode layer 43, the contact hole 44 and the metal electrode section 45 are the same as the respective formation methods for the gate electrode 8, the contact holes 21 and the source electrode 22s, respectively. Therefore, the description thereof will be omitted.

The fabrication method of this embodiment further includes, in addition to the steps described above, a bonding step, a removal step, a covering step and an interconnect section formation step.

In the bonding step, as shown in FIG. 17, the glass substrate 24 on which the electric elements 41 and the fourth interlevel insulation film 42 are formed beforehand is bonded to the insulation film 23 serving as a flattening film. Specifically, a surface of the insulation film 23 is bonded to a surface of the fourth interlevel insulation film 42 of the glass substrate 24.

Next, in the removal step, part of the silicon layer 1 containing a hydrogen element 19 is removed by etching or the like and the silicon layer 1 is etched for device isolation until the LOCOS oxide film 5 is exposed. As a method for etching the substrate, dry etching, wet etching, or combination of dry etching and wet etching may be performed. If dry etching is performed, damage is created on the surface of the silicon layer 1. Therefore, it is preferable that wet etching is performed to eliminate the damage. The thickness of the silicon layer 1 is about 50-200 nm. As a method for removing the silicon layer 1, CMP may be used.

Next, in the covering step, as shown in FIG. 18, a fifth interlevel insulation film 46 is formed so as to cover respective upper surfaces of the fourth interlevel insulation film 42, the silicon layer 1, and the LOCOS oxide film 5 and respective side surfaces of the first, second and third interlevel insulation films 17, 18 and 20 and the insulation film 23. The thickness of the fifth interlevel insulation film 46 is, for example, about 500 nm.

Thereafter, in the interconnect section formation step, as shown in FIG. 16, first, contact holes 47, 48 and 49 are formed. Subsequently, a conductive material is filled in each of the contact holes 47, 48 and 49, and one of the contact holes 47 and the contact hole 48 are connected with each other by the conductive material, thereby forming a first connection section 51. Moreover, the other one of the contact holes 47 and the contact hole 49 are connected to each other by the conductive material, thereby forming a second interconnect section 52. Thereafter, although illustration is omitted, a silicon nitride film is formed and hydrogen treatment is performed. In the above-described manner, the semiconductor device S is fabricated.

Embodiment 3

FIGS. 19 through 27 are cross-sectional views illustrating a semiconductor device S according to example Embodiment 3.

In this embodiment, a gate electrode 8 and an active region 30 are formed and bonded to the glass substrate 24, and then contact holes 21, conduction sections 22 and the like are formed.

In Embodiment 1, the drain electrode 22d and the source electrode 22s are formed between the active region 30 and the glass substrate 24. In contrast, according to this embodiment, a drain electrode 22d and a source electrode 22s are formed in the other side of a semiconductor device section T to a side thereof on which the glass substrate 24 is located with the active region 30 interposed therebetween.

Specifically, in the semiconductor device S, a second interlevel insulation film 18 is stacked on the grass substrate 24. On the second interlevel insulation film 18, as in Embodiment 1, a first interlevel insulation film 17, a gate electrode 8, a gate interconnect layer 9, a LOCOS oxide film 5 and a silicon layer 1 having an active region 30 are provided. In this embodiment, heavily impurity doped regions 55 are formed over a drain region 16d and a source region 16s, respectively.

Part of the silicon layer 1 located in each of second regions R2 is removed from a surface of the LOCOS oxide film 5. The silicon layer 1 and the LOCOS oxide film 5 are covered by a sixth interlevel insulation film 56.

In the sixth interlevel insulation film 56, contact holes 21 over the heavily impurity doped regions 55 are formed, respectively. A conductive material is filled in each of the contact holes 21, so that a drain electrode 22d and a source electrode 22s are formed.

On the other hand, a contact hole 57 is formed through the LOCOS oxide film 5 and the sixth interlevel insulation film 56 so as to be located over the gate interconnect layer 9. A conductive material is filled in the contact hole 57, so that an electrode 58 is formed.

On the sixth interlevel insulation film 56, a silicon nitride film 59 is stacked so as to cover the electrode 58, the drain electrode 22d and the source electrode 22s. In the manner described above, the semiconductor device S is fabricated.

Fabrication Method

Next, a method for fabricating the semiconductor device S of this embodiment will described with reference to FIGS. 19 through 27.

The fabrication method of this embodiment includes the same steps as those from the recess formation step to the third ion implantation step (FIGS. 2 through 8) of Embodiment 1.

The fabrication method of this embodiment further includes, in addition to the above-described steps, a fourth ion implantation step, an activation step, an interlevel insulation film flattening step, a peeling layer formation step, a bonding step, a separation step, a removal step and a conduction section formation step.

Figure 20:
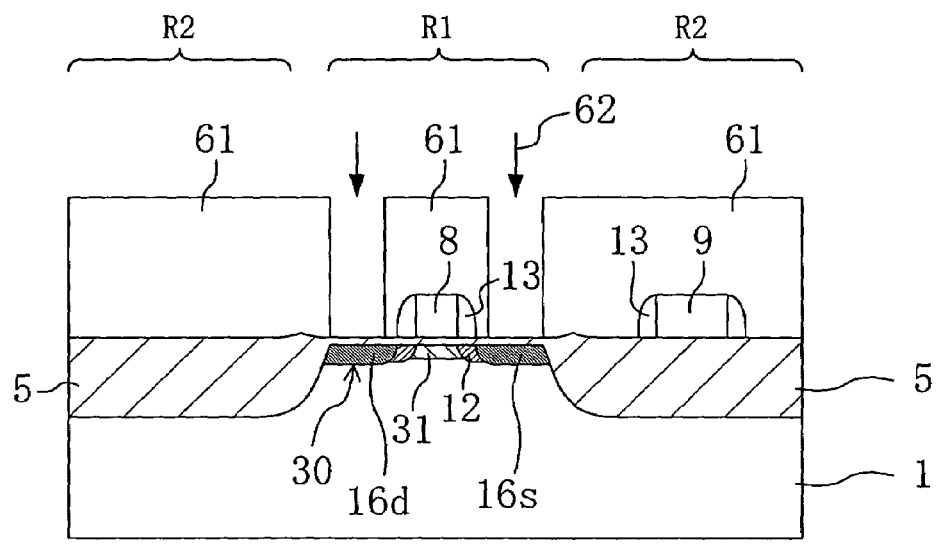
FIG. 20 is a cross-sectional view illustrating a forth ion implantation step.

In the fourth ion implantation step, as shown in FIG. 20, a resist mask 61 is formed over the gate electrode 8 and sidewalls 13, and then an n-type impurity 62 is introduced, by ion implantation, into regions located under heavily impurity regions 16 (i.e., a drain region 16d and a source region 16s). Thus, the heavily impurity doped regions 55 are formed as shown in FIG. 21.

At this point of time, each of the heavily impurity doped regions 55 is located deeper than the previously formed heavily impurity doped regions 16 so as to be adjacent to an associated one of the heavily impurity doped regions 16 in the depth direction, so that each of the heavily impurity doped regions 55 is in electrical continuity with the associated one of the heavily impurity doped regions 16. The heavily impurity doped regions 55 are provided for making it possible to achieve connection of a metal interconnect contact to the source region 16s and drain region 16d of an NMOS transistor in a simple manner in the bonding step and subsequent process steps.

For example, the n-type impurity 62 is introduced into the silicon substrate 1 by first ion implantation with phosphorus as an ion species at an implantation energy of 45 KeV and a dose of $2 \times 10^{15}$ cm$^{-2}$ and second implantation with phosphorus as an ion species at an implantation energy of 100 KeV and a dose of $2 \times 10^{15}$ cm$^{-2}$. Thus, electrical continuity in a region extending from the heavily impurity doped region 16 to a depth of 170 nm can be achieved. The step of forming the heavily impurity doped regions 55 is not necessary and therefore may be omitted.

Figure 21:
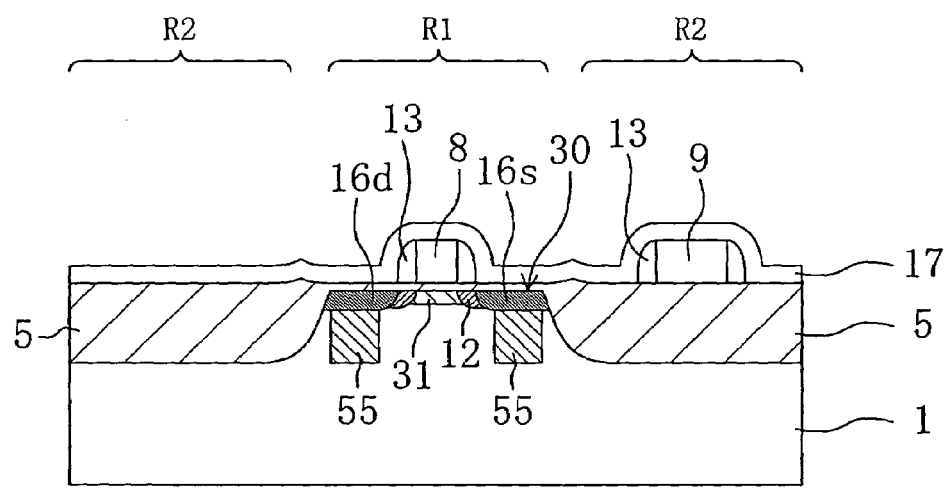
FIG. 21 is a cross-sectional view illustrating an activation step.

Next, in the activation step, as shown in FIG. 21, the resist mask 61 is removed and then a first interlevel insulation film 17 is formed so as to have a thickness of 100 nm. Thereafter, the impurity element introduced into the silicon substrate 1 is activated by heat treatment. For example, the heat treatment is performed at 900° C. for 10 minutes. Lamp heating or laser heating may be used for the heat treatment.

Figure 22:
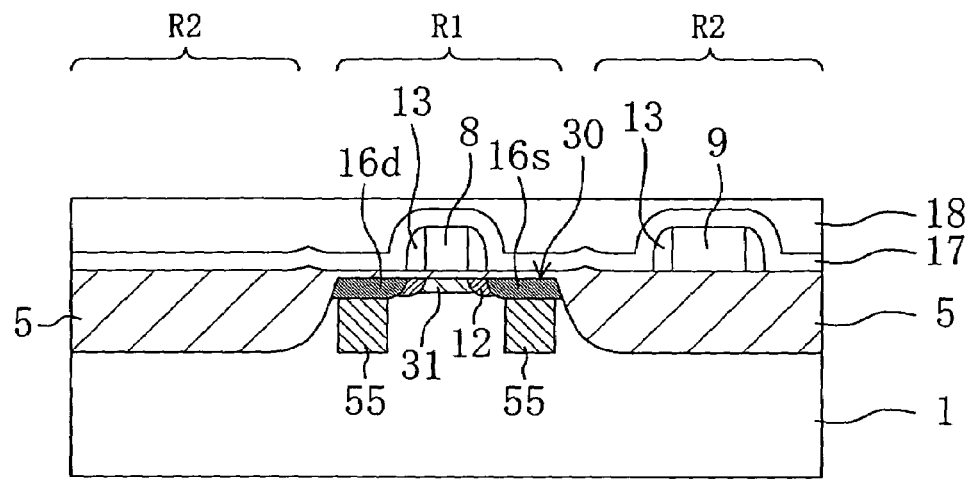
FIG. 22 is a cross-sectional view illustrating an interlevel insulation film flattening step.

Subsequently, in the interlevel insulation film flattening step, as shown in FIG. 22, an insulation film is formed on the first interlevel insulation film 17, and then a surface of the insulation film is flattened, for example, by CMP or the like, thereby forming a second insulation film 18. A method for surface flattening is not limited to CMP. Moreover, in the activation step, CMP or some other flattening technique may be performed after the first interlevel insulation film 17 is formed so as to have a larger thickness.

Figure 23:
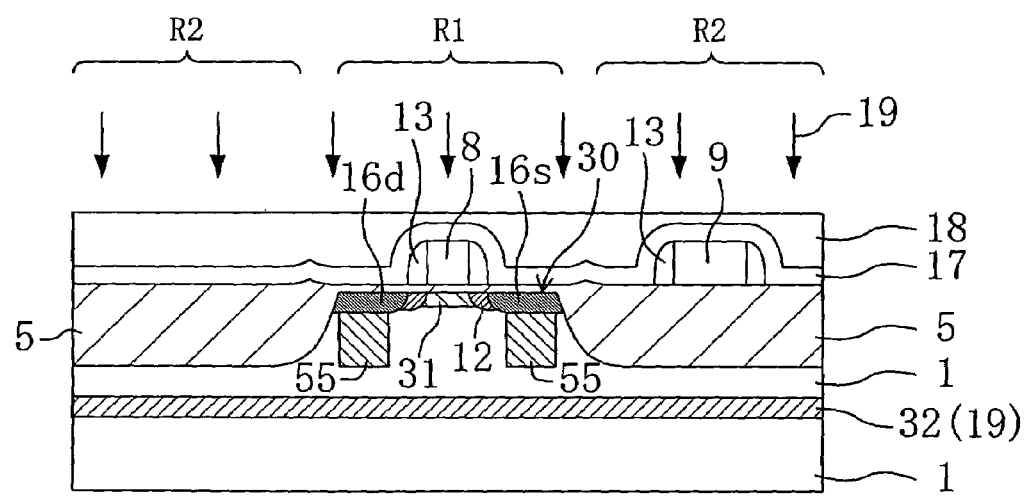
FIG. 23 is a cross-sectional view illustrating a peeling layer formation step.

Thereafter, in the peeling layer formation step, as shown in FIG. 23, hydrogen 19 as a peeling material is introduced into the silicon substrate 1 by ion implantation, thereby forming a peeling layer 32. For conditions of the ion implantation, for example, a dose is $1\text{-}5 \times 10^{16}$ cm$^{-2}$ and an implantation energy is 50-200 KeV. Some other element (an inert element such as He, Ne and Ar) may be implanted continuously to the hydrogen element 19.

Figure 24:
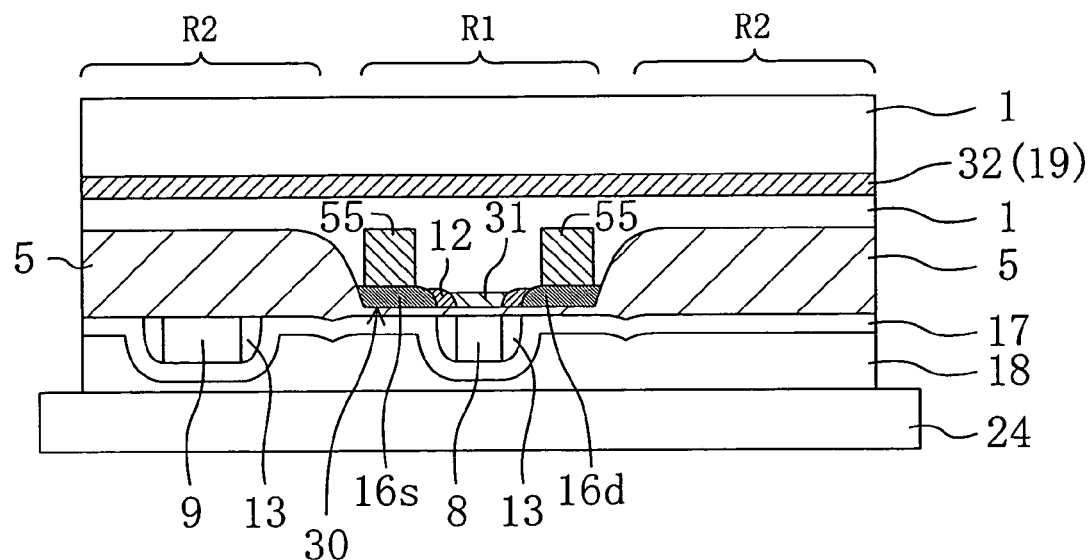
FIG. 24 is a cross-sectional view illustrating a bonding step.

Next, in the bonding step, as shown in FIG. 24, the glass substrate 24 is bonded to the flattened surface of the second interlevel insulation film 18. In FIG. 24, the semiconductor device S being vertically flipped is shown.

Figure 25:
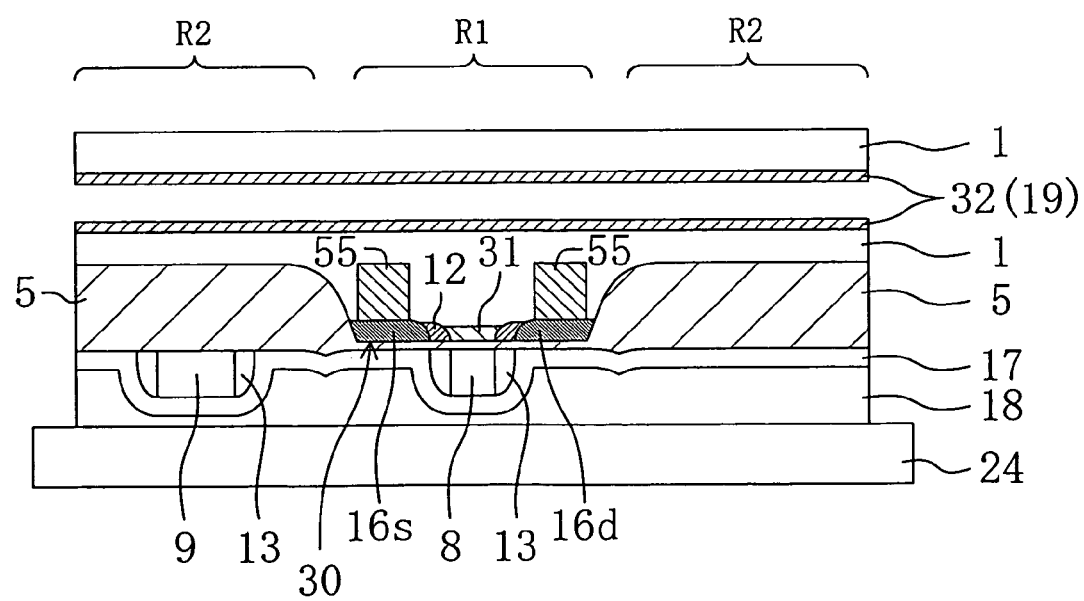
FIG. 25 is a cross-sectional view illustrating a separation step.

Subsequently, in the separation step, as shown in FIG. 25, heat treatment is performed at 600° C. for several or more minutes, thereby separating part of the silicon substrate 1 at around an implantation peak for the hydrogen element 19 in the peeling layer 32. Thus, a structure formed between the implantation peak for the hydrogen element 19 in the silicon substrate 1 and the second interlevel insulation film 18 is moved to the glass substrate 24.

Figure 26:
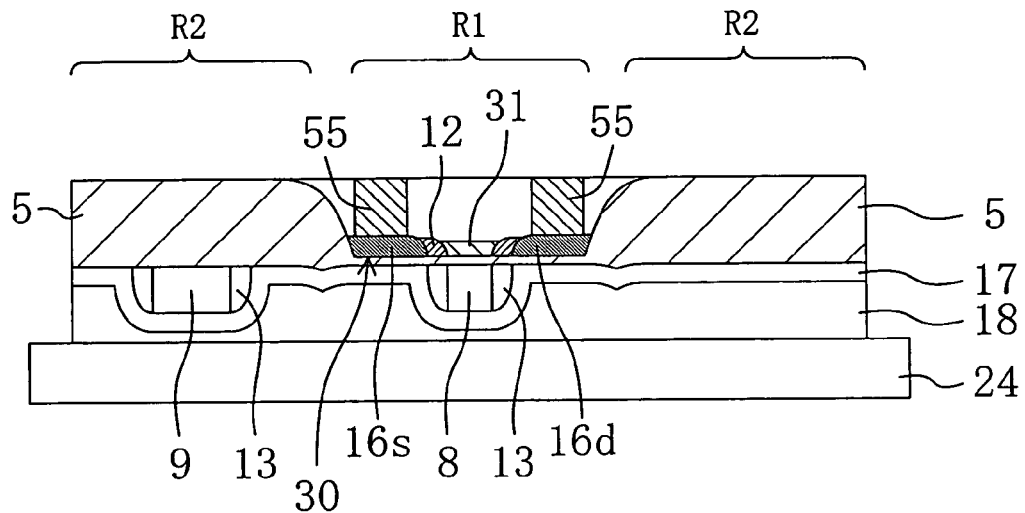
FIG. 26 is a cross-sectional view illustrating a removal step.

Next, in the removal step, as shown in FIG. 26, part of the silicon layer 1 which has received ion implantation damage from the hydrogen implantation at around the implantation peak for the hydrogen element 19 is removed, and the silicon layer 1 is etched until the LOCOS oxide film 5 is exposed to isolate devices from one another. As a method for removing the silicon layer 1, dry etching, wet etching or combination of dry etching and wet etching can be used. If dry etching is performed, damage might be created on the surface of the silicon layer 1. Therefore, it is preferable that wet etching is performed to eliminate the damage. The thickness of the silicon layer 1 is about 50-200 nm. As a method for removing the silicon layer 1, CMP may be used.

Figure 27:
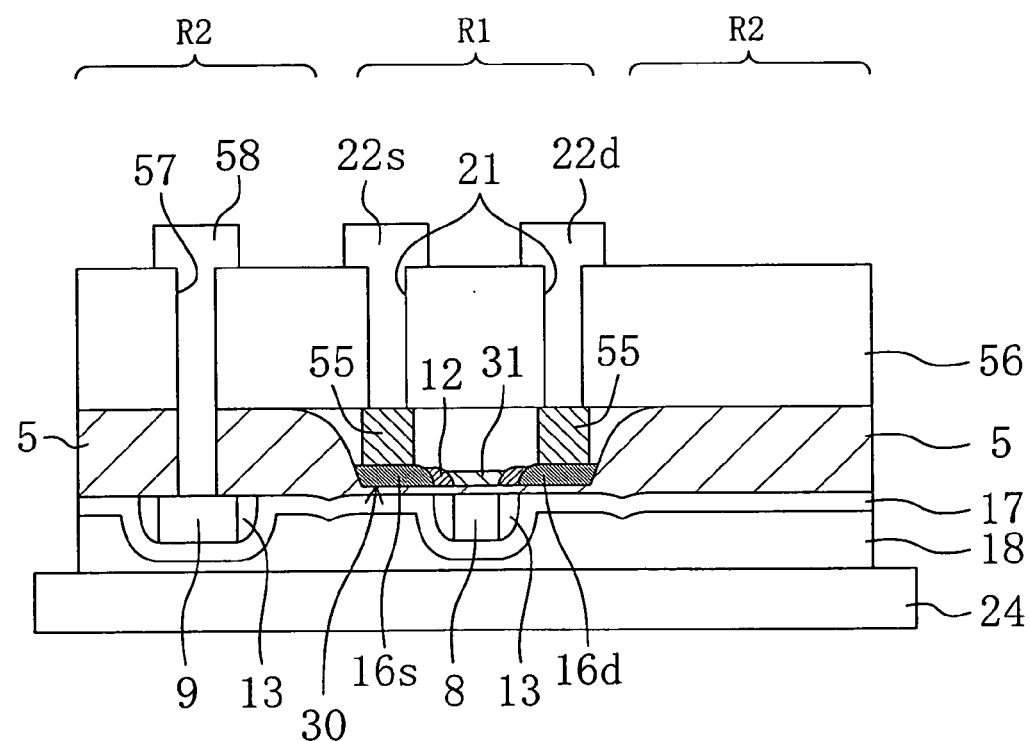
FIG. 27 is a cross-sectional view illustrating a conduction section formation step.
Figure 28:
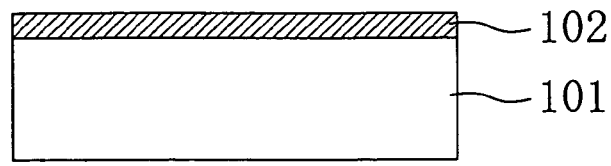
FIG. 28 is a cross-sectional view illustrating how a silicon oxide layer is formed in known method for forming a SOI substrate.
Figure 29:
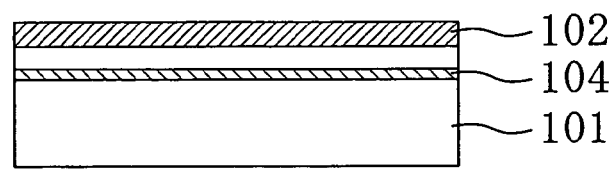
FIG. 29 is a cross-sectional view illustrating how a hydrogen-implanted layer is formed in the known method for forming a SOI substrate.
Figure 30:
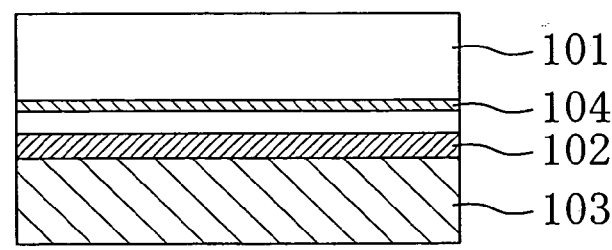
FIG. 30 is a cross-sectional view illustrating how bonding to a glass substrate is performed in the known method for forming a SOI substrate.
Figure 31:
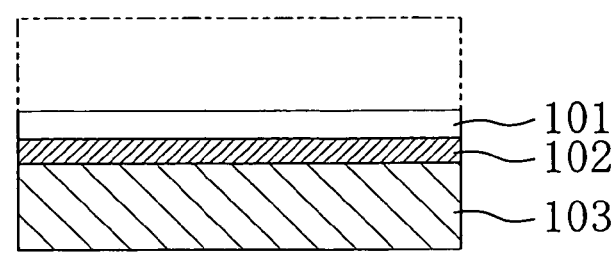
FIG. 31 is a cross-sectional view illustrating how part of a silicon layer is separated in the known method for forming a SOI substrate.
Figure 32:
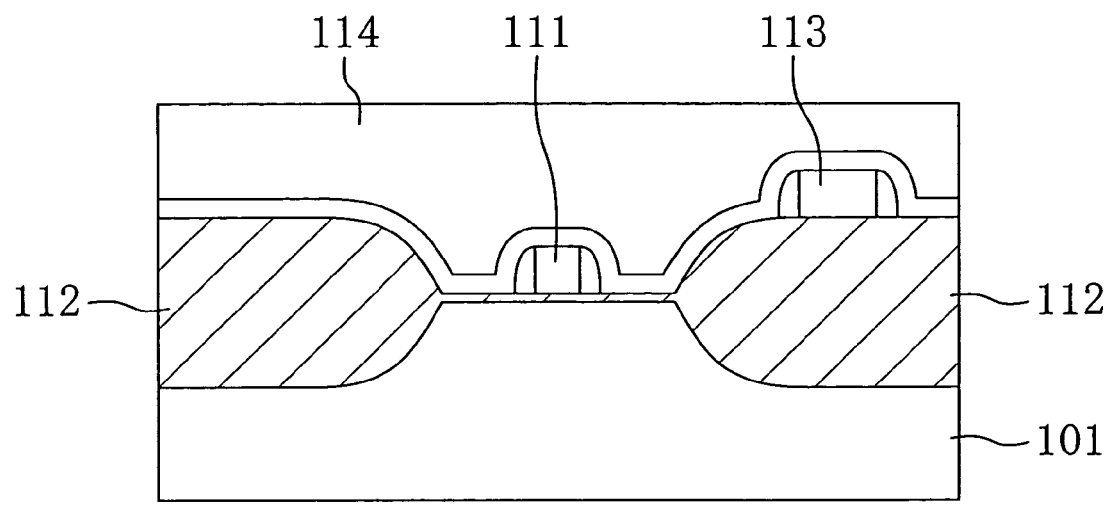
FIG. 32 is a cross-sectional view illustrating a known LOCOS element separation structure.
Figure 33:
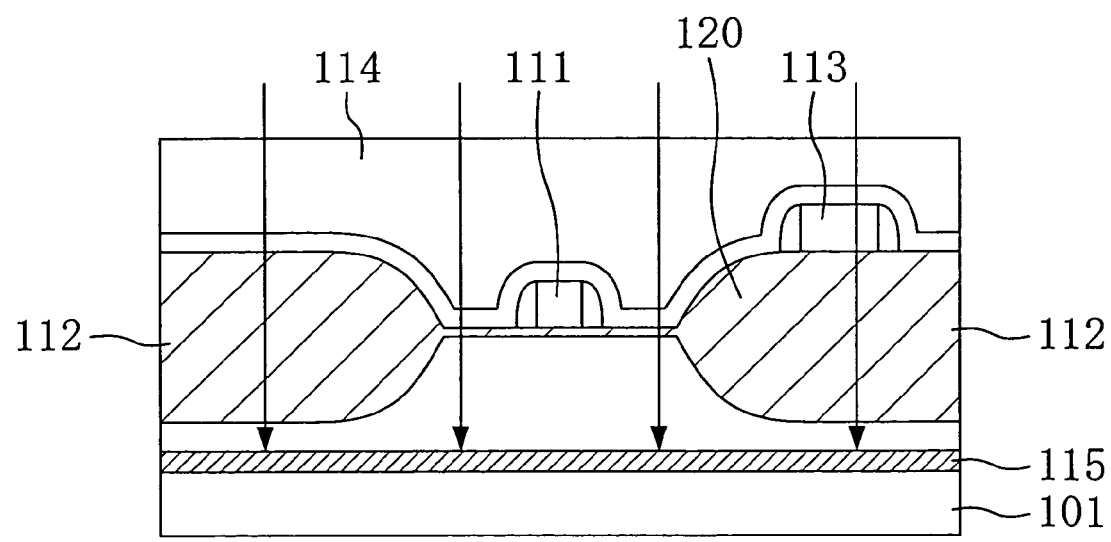
FIG. 33 is a cross-sectional view illustrating how hydrogen is implanted into the known LOCOS element separation structure.

Thereafter, in the conduction section formation step, as shown in FIG. 27, a sixth interlevel insulation film 56 is first formed on the silicon layer 1 and the LOCOS oxide film 5 by CVD or the like so as to have a thickness of about 700 nm.

Subsequently, contact holes 21 are formed over the heavily impurity doped regions 55 and a contact hole 57 is formed over the gate interconnect layer 9. The contact holes 21 may be formed so as to pass through to the heavily impurity doped regions 16, respectively. Thereafter, a conductive material is filled in each of the contact holes 21, thereby forming a drain electrode 22d and a source electrode 22s. Also, a conductive material is filled in the contact hole 57, thereby forming a metal electrode 58. As has been described, the conduction section formation step is performed after the bonding step.

When there is a large difference between a depth from a surface of the sixth interlevel insulation film 56 to each of the heavily impurity doped region 55 and a depth from the surface to the gate interconnect layer 9, the contact holes 21 and 57 may be formed separately.

Subsequently, as shown in FIG. 1, a silicon nitride film 59 is formed on the surface of the sixth interlevel insulation film 56 so as to have a thickness of about 200 nm, and then hydrogen treatment is performed. In the above-described manner, the semiconductor device S is fabricated.

OTHER EMBODIMENTS

In each of the above-described embodiments, the recess 35 is formed beforehand in the silicon substrate 1. However, the present invention is not limited thereto. Specifically, without forming the recess 35, the LOCOS oxide film 5 may be formed directly on a surface of the planer silicon substrate 1 by the LOCOS technique. In this case, the LOCOS oxide film 5 is formed to have part protruding from a surface of the gate oxide film or the like covering the active region. Therefore, the LOCOS oxide film 5 has to be flattened.

Specifically, a method for fabricating a semiconductor device according to the present invention includes the LOCOS oxide film formation step of forming the LOCOS oxide film S in each of second regions R2 in the silicon layer 1 and the flattening step of flattening a surface of the LOCOS oxide film 5 in each of the second regions R2 so as to be at the same height as that of a surface of the gate oxide film 7 covering the active region 30. Using this method, the same effects of those of each of the above-described embodiments can be also achieved. However, in view of the fact that the step of flattening the LOCOS oxide film 5 can be omitted, it is preferable to form the recess 35 as described in each of the above-described embodiment.

Moreover, after the recess 35 has been formed beforehand in the silicon substrate 1, an isolation insulation film such as an oxide film over a substrate is deposited and then flattening is performed by CMP, etching or the like so that a surface of the LOCOS oxide film 5 is at the same height as that of a surface of the gate oxide film 7 covering the active region 30. Thus, the same effects as those of each of the above-described embodiments can be achieved. Although the flattening step is added, bird's beaks of the LOCOS oxide film are not created and the degree of integration of a semiconductor circuit is advantageously improved.

As has been described, the present invention is useful for a method for fabricating a semiconductor device including an isolation insulation film such as a LOCOS oxide film and such a semiconductor device. Specifically, the present invention is suitable for reliably forming a peeling layer, controlling ion implantation of a peeling material in a simple manner, and improving controllability over the thickness of a silicon layer.

What is claimed is:

1. A semiconductor device comprising:
   a substrate layer;
   a plurality of first regions each comprising an active region;
   a plurality of second regions each being provided between adjacent ones of the first regions;
   an isolation insulation film formed in each of the second regions and configured so that a surface of the isolation insulation film is at a same height as a surface of a film directly stacked over the active region; and
   wherein part of the substrate layer is separated along a peeling layer formed by ion-implanting a peeling material, thereby removing the part of the substrate layer with the peeling layer.

2. The semiconductor device of claim 1, further comprising a flattening film for covering part of the substrate layer located in each of the first regions and the isolation insulation film,
   wherein a substrate is bonded to a surface of the flattening film.

3. The semiconductor device of claim 2, wherein the substrate is a glass substrate.

4. The semiconductor device of claim 2, wherein a MOS transistor is formed in each of the first regions,
   wherein the film covering the active region is a gate oxide film,
   wherein a gate electrode of the MOS transistor is formed on a surface of the gate oxide film, and
   wherein a gate interconnect layer is formed in the isolation insulation film so as to be connected to the gate electrode.

5. The semiconductor device of claim 1, wherein the substrate layer is a silicon layer.

6. The semiconductor device of claim 1, wherein the peeling material is hydrogen.

7. The semiconductor device of claim 1, wherein a MOS transistor is formed in each of the first regions.

8. The semiconductor device of claim 7, wherein the film covering the active region is a gate oxide film, and
   wherein a gate electrode of the MOS transistor is formed on a surface of the gate oxide film.

9. A semiconductor substrate comprising:
   a substrate layer;
   a plurality of first regions each comprising an active region;
   a plurality of second regions each being provided between adjacent ones of the first regions;
   a recess formed in a surface of part of the substrate layer located in each of the second regions;
   a LOCOS oxide film formed in the recess by a LOCOS technique, the LOCOS oxide film being configured so that a surface of the LOCOS oxide film is at a same height as a surface of a film directly stacked over the active region; and
   wherein part of the substrate layer is separated along a peeling layer formed by ion-implanting a peeling material, thereby removing the part of the substrate layer with the peeling layer.

10. The semiconductor device of claim 9, further comprising a flattening film for covering part of the substrate layer located in each of the first regions and the LOCOS oxide film,
    wherein a substrate is bonded to a surface of the flattening film.

11. The semiconductor device of claim 10, wherein the substrate is a glass substrate.

12. The semiconductor device of claim 10, wherein a MOS transistor is formed in each of the first regions,
    wherein the film covering the active region is a gate oxide film,
    wherein a gate electrode of the MOS transistor is formed on a surface of the gate oxide film, and wherein a gate interconnect layer is formed in the LOCOS oxide film so as to be connected to the gate electrode.

13. The semiconductor device of claim 9, wherein the substrate layer is a silicon layer.

14. The semiconductor device of claim 9, wherein the peeling material is hydrogen.

15. The semiconductor device of claim 9, wherein a MOS transistor is formed in each of the first regions.

16. The semiconductor device of claim 15, wherein the film covering the active region is a gate oxide film, and
wherein a gate electrode of the MOS transistor is formed on a surface of the gate oxide film.

17. A semiconductor substrate comprising:
a substrate layer;
a plurality of first regions each comprising active region;
a plurality of second regions each being provided between adjacent ones of the first regions;
a LOCOS oxide film formed by a LOCOS technique is provided in each of the second regions, the LOCOS film being configured so that a surface of the LOCOS film is at a same height as a surface of a film directly stacked over the active region; and
wherein part of the substrate layer is separated along a peeling layer formed by ion-implanting a peeling material, thereby removing the part of the substrate layer with the peeling layer.

18. The semiconductor device of claim 17, further comprising a flattening film covering part of the substrate layer located in each of the first regions and the LOCOS oxide film,
wherein a substrate is bonded to a surface of the flattening film.

19. The semiconductor device of claim 18, wherein the substrate is a glass substrate.

20. The semiconductor device of claim 18, wherein a MOS transistor is formed in each of the first regions,
wherein the film covering the active region is a gate oxide film,
wherein a gate electrode of the MOS transistor is formed on a surface of the gate oxide film, and
wherein a gate interconnect layer is formed in the LOCOS oxide film so as to be connected to the gate electrode.

21. The semiconductor device of claim 17, wherein the substrate layer is a silicon layer.

22. The semiconductor device of claim 17, wherein the peeling material is hydrogen.

23. The semiconductor device of claim 17, wherein a MOS transistor is formed in each of the first regions.

24. The semiconductor device of claim 17, wherein the film covering the active region is a gate oxide film, and
wherein a gate electrode of the MOS transistor is formed on a surface of the gate oxide film.

25. A semiconductor substrate comprising:
a substrate layer;
a plurality of first regions each comprising an active region;
a plurality of second regions each being provided between adjacent ones of the first regions;
a recess formed in a surface of part of the substrate layer located in each of the second regions;
an isolation insulation film in the recess, the isolation insulation film being configured so that a surface of the isolation insulation film is at a same height as a surface of a film directly stacked over the active region; and
wherein part of the substrate layer is separated along a peeling layer formed by ion-implanting a peeling material, thereby removing the part of the substrate layer with the peeling layer.

26. The semiconductor device of claim 25, further comprising a flattening film covering part of the substrate layer located in each of the first regions and the isolation insulation film,
wherein a substrate is bonded to a surface of the flattening film.

27. The semiconductor device of claim 26, wherein the substrate is a glass substrate.

28. The semiconductor device of claim 26, wherein a MOS transistor is formed in each of the first regions,
wherein the film covering the active region is a gate oxide film,
wherein a gate electrode of the MOS transistor is formed on a surface of the gate oxide film, and
wherein a gate interconnect layer is formed in the isolation insulation film so as to be connected to the gate electrode.

29. The semiconductor device of claim 25, wherein the substrate layer is a silicon layer.

30. The semiconductor device of claim 25, wherein the peeling material is hydrogen.

31. The semiconductor device of claim 25, wherein a MOS transistor is formed in each of the first regions.

32. The semiconductor device of claim 31, wherein the film covering the active region is a gate oxide film, and
wherein a gate electrode of the MOS transistor is formed on a surface of the gate oxide film.

* * * * *